(12) United States Patent
Kimura et al.

(10) Patent No.: US 11,966,131 B2
(45) Date of Patent: Apr. 23, 2024

(54) DISPLAY DEVICE

(71) Applicant: Japan Display Inc., Tokyo (JP)

(72) Inventors: Fumiya Kimura, Tokyo (JP); Isao Suzumura, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/196,312

(22) Filed: May 11, 2023

(65) Prior Publication Data

US 2023/0280623 A1    Sep. 7, 2023

Related U.S. Application Data

(63) Continuation of application No. 17/851,982, filed on Jun. 28, 2022, now Pat. No. 11,656,514, which is a
(Continued)

(30) Foreign Application Priority Data

Feb. 27, 2020 (JP) .................................. 2020-031465

(51) Int. Cl.
| | | |
|---|---|---|
| *G02F 1/1362* | (2006.01) | |
| *G02F 1/1333* | (2006.01) | |
| *G02F 1/1339* | (2006.01) | |
| *G02F 1/1343* | (2006.01) | |
| *G02F 1/1368* | (2006.01) | |

(Continued)

(52) U.S. Cl.
CPC .... *G02F 1/136227* (2013.01); *G02F 1/13394* (2013.01); *G02F 1/13439* (2013.01); *G02F 1/136213* (2013.01); *G02F 1/1368* (2013.01); *G02F 1/13306* (2013.01);
(Continued)

(58) Field of Classification Search
CPC .............. G02F 1/13306; G02F 1/1333; G02F 1/133345; G02F 1/1335; G02F 1/133514; G02F 1/13394; G02F 1/1343; G02F 1/134309; G02F 1/134318; G02F 1/134363; G02F 1/13439; G02F 1/1362; G02F 1/136209; G02F 1/136213;
(Continued)

(56) References Cited

U.S. PATENT DOCUMENTS

2019/0056620 A1    2/2019   Akiyoshi
2019/0302554 A1*  10/2019   Chang ............... G02F 1/136227

FOREIGN PATENT DOCUMENTS

| CN | 205750219 U | 11/2016 |
| JP | 2006098756 A | 4/2006 |

(Continued)

OTHER PUBLICATIONS

International Search Report from corresponding PCT application PCT/JP2020/043452, dated Feb. 2, 2021.

*Primary Examiner* — Thoi V Duong
(74) *Attorney, Agent, or Firm* — K&L Gates LLP

(57) ABSTRACT

A display device is provided and includes a substrate on which a TFT is formed. The display device including an organic film formed on the TFT, the organic film having a through hole, and a first common electrode, an upper pixel electrode and a second common electrode which are stacked in this order above the organic passivation film, a filler being filled in the through hole, and wherein the upper pixel electrode is electrically connected with the TFT, and an edge of the upper pixel electrode is located directly on the filler.

12 Claims, 28 Drawing Sheets

Related U.S. Application Data continuation of application No. PCT/JP2020/043452, filed on Nov. 20, 2020.

(51) Int. Cl.
    *G02F 1/133*     (2006.01)
    *G02F 1/1335*     (2006.01)
    *G03F 7/00*     (2006.01)

(52) U.S. Cl.
    CPC .. *G02F 1/133345* (2013.01); *G02F 1/133514* (2013.01); *G03F 7/0007* (2013.01)

(58) Field of Classification Search
    CPC ......... G02F 1/136222; G02F 1/136227; G02F 1/136286; G02F 1/1368; G03F 7/0007
    See application file for complete search history.

(56) References Cited

FOREIGN PATENT DOCUMENTS

| | | |
|---|---|---|
| JP | 2010145457 A | 7/2010 |
| JP | 2015163946 A | 9/2015 |
| JP | 2019035884 A | 3/2019 |

* cited by examiner

B-B

DISPLAY DEVICE

The present application is a continuation of U.S. patent application Ser. No. 17/851,982, filed on Jun. 28, 2022, which is a continuation of International Application No. PCT/JP2020/043452, filed on Nov. 20, 2020, which claims priority to Japanese Patent Application No. 2020-031465, filed on Feb. 27, 2020. The contents of these applications are incorporated herein by reference in their entirety.

BACKGROUND OF THE INVENTION

(1) Field of the Invention

The present invention relates to an ultra high definition display device, such as a liquid crystal display device, which can be used for a VR (Virtual Reality) device or the like.

(2) Description of the Related Art

A liquid crystal display device used in a VR (Virtual Reality) device or the like requires a high-definition screen of 1300 ppi or more. That is, the pitch of the pixel sets of red (R), green (G), and blue (B) is 19 μm or less. As a result, the width of each pixel of R, G, and B in the horizontal direction becomes about 6.3 μm, and the area of each pixel becomes very small.

On the other hand, a thick organic passivation film is formed between the switching TFT (Thin Film Transistor) and the pixel electrode in order to reduce capacitive coupling between the video signal line and the pixel electrode. In order to connect the TFT and the pixel to each other, a through-hole is formed in the organic passivation film. Even if the pixel pitch becomes small, the size of the through hole cannot be reduced proportionally, so that the ratio of the relative area of the through hole in the pixel increases.

In a liquid crystal display device, there are a transmissive type using a backlight and a reflective type using an external light reflection. In addition, there is a so-called transflective liquid crystal display device in which a pixel is divided into two pixels, and a transmissive type and a reflective type are formed in one pixel. In Patent Document 1, in such a transflective liquid crystal display device, a configuration is described in which a through-hole region of an organic passivation film is used as a reflective display region in order to increase an area of a reflective region.

PRIOR ART REFERENCE

Patent Document

Patent document 1: Japanese patent application laid open No. 2006-098756

SUMMARY OF THE INVENTION

When the pixel pitch becomes small, the transmittance of the pixel, i.e., the region contributing to image formation becomes small, and at the same time, it becomes difficult to secure the pixel capacitance. In addition, in order to prevent the area of the through hole in the pixel from becoming relatively large, it is necessary to make the taper of the through hole steep.

As a result, it is necessary to connect the pixel electrode and the TFT to each other through the deep through-hole. Patterning of a pixel electrode in such a through hole is difficult. Further, when the pixel pitch is small, the interval between the electrodes becomes small, and thus there is a risk that the adjacent pixel electrodes will be connected to each other.

It is an object of the present invention is to provide a high definition display device which ensures transmittance of pixels, ensures pixel capacitance, and ensures to avoid patterning defects as short between the adjacent pixel electrodes and so forth. Note that such a problem is not limited to the liquid crystal display device, and the same counter measure can be applied to other display devices such as an organic EL display device and so forth.

The present invention solves the above explained problems; the concrete structures are as follows.

(1) A display device including a substrate on which a TFT (Thin Film Transistor) is formed, an organic passivation film formed on the TFT, and a first pixel electrode, a first common electrode, a second pixel electrode and a second common electrode formed on the organic passivation film, in which the first pixel electrode is connected with the TFT via a through hole formed in the organic passivation film, the through hole is filled with a filler, and an edge of the second pixel electrode is at an upper portion of the filler.

(2) The display device according to (1), in which a first insulating film is formed between the first pixel electrode and the first common electrode to form a first capacitance, a second insulating film is formed between the first common electrode and the second pixel electrode to form a second capacitance, a third insulating film is formed between the second pixel electrode and the second common electrode to form a third capacitance, and the first capacitance, and the second capacitance and the third capacitance are connected to each other in parallel.

(3) The display device according to (1), in which a distance between an upper surface of the filler and the substrate is smaller than a distance between an upper part of the organic passivation film and the substrate.

DETAILED DESCRIPTION OF THE PREFERRED EMBODIMENTS

Hereinafter, the present invention will be described in detail with reference to embodiments. Although the following embodiments are described for a liquid crystal display device as an example, the present invention is applicable not only to a liquid crystal display device but also to other display devices such as an organic EL display device and so forth.

Embodiment 1

Figure 1:
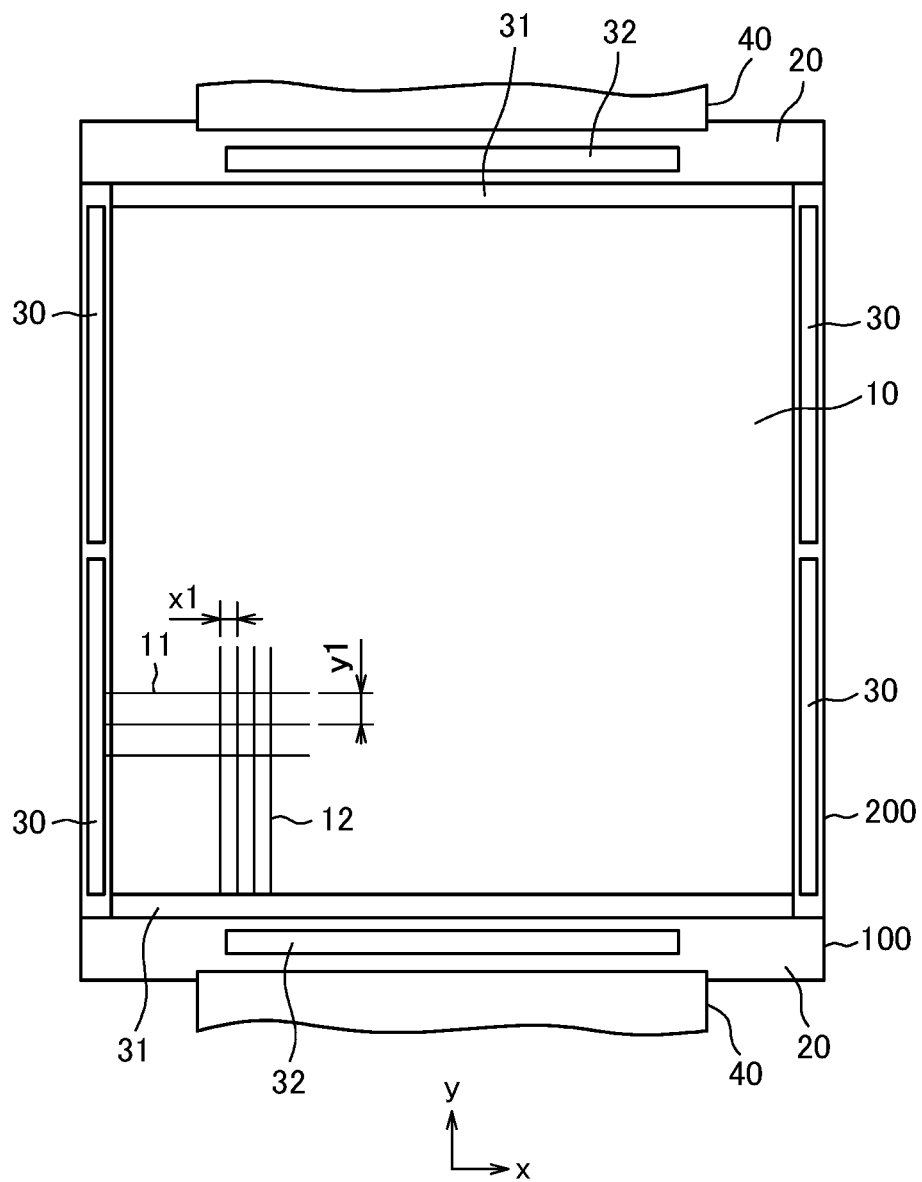
FIG. 1 is a plan view of a liquid crystal display device.

FIG. 1 is an example of a liquid crystal display device to which the present invention is applied. FIG. 1 is a plan view of an ultra high definition liquid crystal display device used in a VR (Virtual Reality) device or the like. In FIG. 1, in the display region 10, scanning lines 11 extend in the horizontal direction (x direction) and are arranged in the vertical direction (y direction), and the video signal lines 12 extend in the vertical direction and are arranged in the horizontal direction. A pixel is formed in an area surrounded by the scanning line 11 and the video signal line 12. In each pixel, a size x1 in the x direction is 6.3 μm and a size y1 in the y direction is 8.4 μm. This corresponds, for example, to 1300 ppi.

In FIG. 1, a terminal region 20 is formed on the upper side in the y direction and the lower side in the y direction with respect to the display region 10. Since the liquid crystal display device shown in FIG. 1 has a very small pitch and therefore there exist a large number of wirings, thus, the terminal region 20 is formed on both sides of the display region 10. A driver IC 32 is mounted on the terminal region 20, and a flexible wiring substrate 40 for supplying powers and signals to the liquid crystal display device is connected thereto.

In the display area 10 of FIG. 1, the display area 10 is divided into the upper part in y direction and the bottom part in y direction, and the scanning line driving circuit 30 is formed in the right and left of each display area 10. Accordingly, a total of four scanning line driving circuits 30 are formed on the left and right sides of the display region 10. The scanning line driving circuit 30 is formed of a polysilicon TFT.

Figure 2:
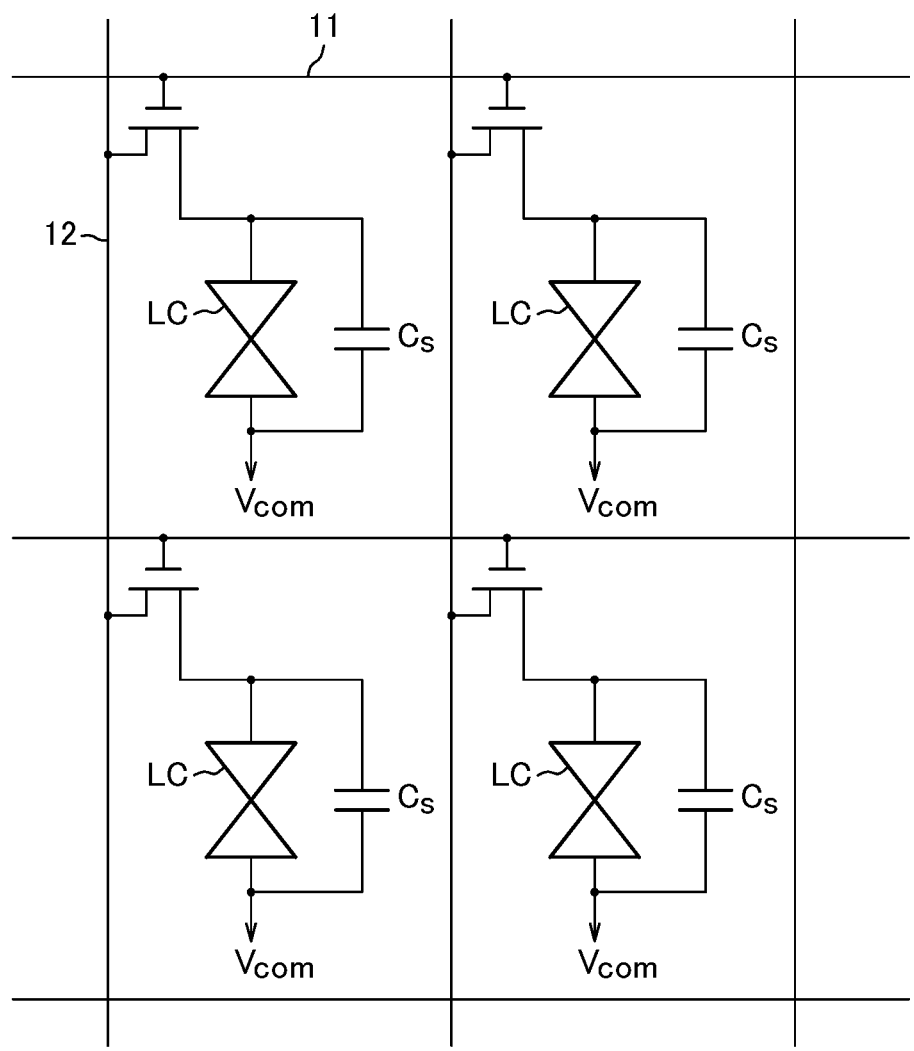
FIG. 2 is an equivalent circuit diagram of the pixel.

FIG. 2 is an equivalent circuit of each pixel. In FIG. 2, a video signal is applied from a source electrode of a TFT to a pixel electrode to control the transmittance of the liquid crystal LC. Vcom is a common voltage. Although the storage capacitor Cs is formed with the liquid crystal LC interposed therebetween, it is difficult to secure a sufficient storage capacitance Cs when the area of the pixel becomes small. In Embodiment 1, as will be described later, a storage capacitor Cs is secured by forming a pixel electrode and a common electrode in two layers.

Figure 3:
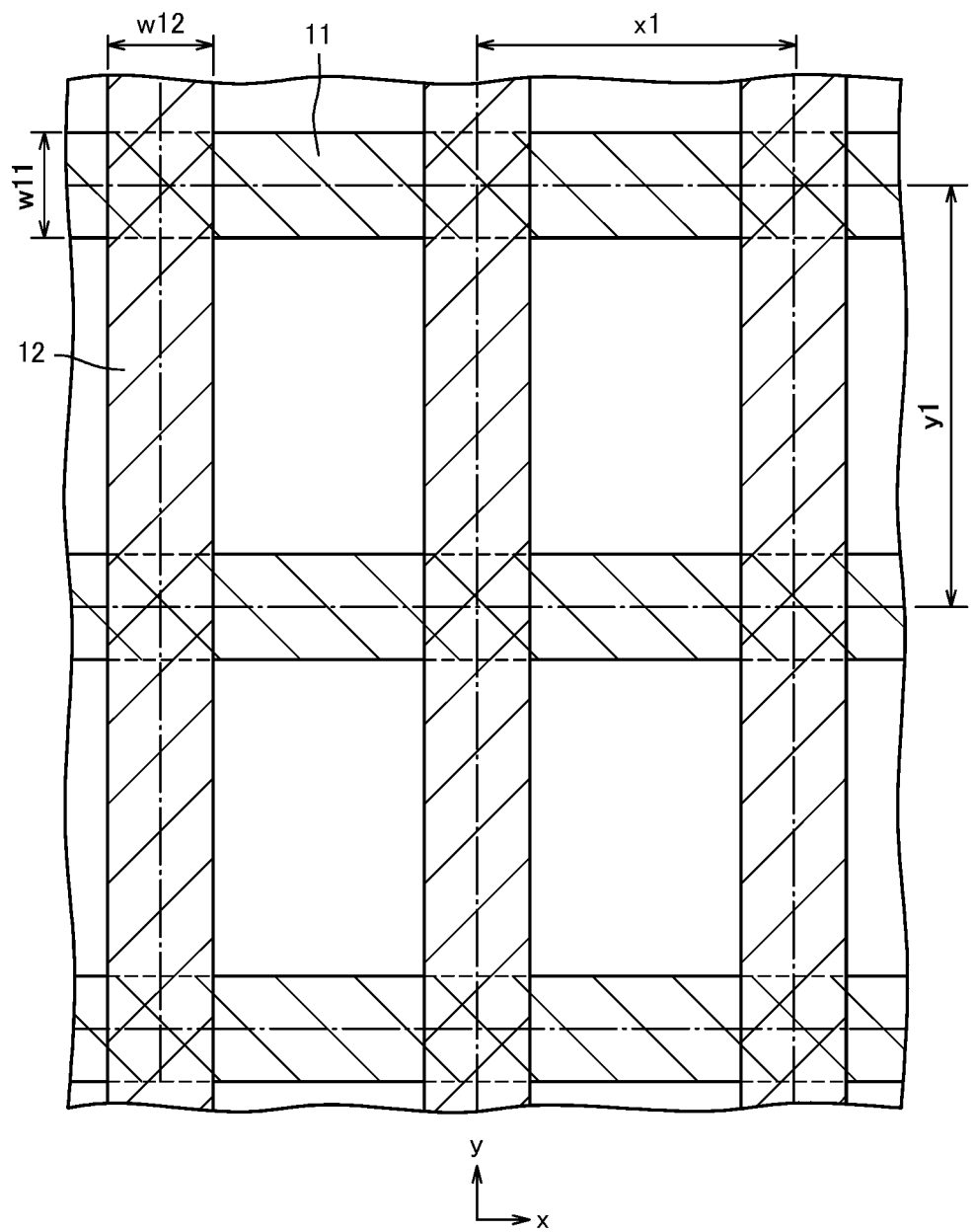
FIG. 3 is a plan view of partitions of pixels according to embodiment 1.

FIG. 3 is a plan view showing a relation between each pixel and the scanning line 11 and the image signal line 12. In FIG. 3, a width w11 of the scanning line 11 is 2 μm, and a width w12 of the video signal line 12 is 2 μm. The length x1 of the pixel in the x direction is 6.3 μm, and the length y1 of the pixel in the y direction is 8.4 μm. Thus, the transmissive areas available for image formation have a very limited area.

Figure 4:
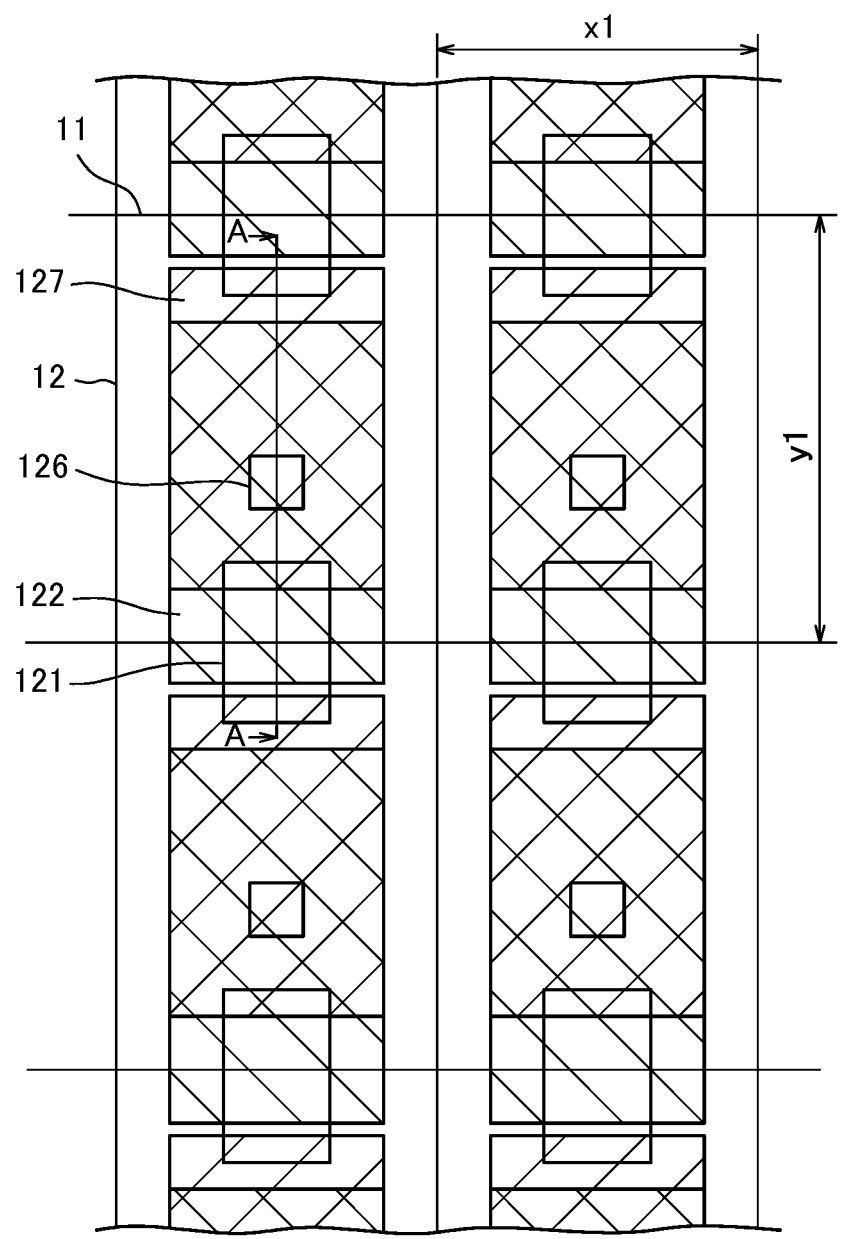
FIG. 4 is a plan view of layout of the pixel electrode and the through hole according to embodiment 1.

FIG. 4 is a plan view showing the pixel electrodes 122 and 127 and the through holes 121 and 126. In this embodiment, in order to secure a storage capacity, a pixel electrode and a common electrode overlap each other in two layers. In other words, the first pixel electrode, the second pixel electrode, the first common electrode, and the second common electrode are overlapped via insulating layers. FIG. 4 shows only the pixel electrodes 122 and 127 since it is difficult to see a plan view in which four electrodes are overlapped with one another.

In FIG. 4, a first through hole 121 formed in the color filter and the organic passivation film is formed on the upper side (upper side in the Y direction in FIG. 4) and the lower side (lower side in the Y direction in FIG. 4) of the scanning line 11. However, the first through hole 121 is used only for one of the upper and lower pixels. A first pixel electrode 122 is formed so as to cover most of the through hole 121. The first pixel electrode 122 is directly connected to the source electrode of the TFT. In FIG. 4, the scanning line 11 is represented by only a center line of the scanning line 11, and the video signal line 12 is represented by only a center line of the video signal line 12.

A second pixel electrode 127 is formed so as to overlap with ends of two first through holes 121 and 121 through the first capacitance insulating film, the first common electrode, and the second capacitance insulating film. The second pixel electrode 127 is connected to the first pixel electrode 122 via a second through-hole 126 formed in the first capacitance insulating film and the second capacitance insulating film. Electric lines of force passing through the liquid crystal layer are generated between the second pixel electrode 127 and the second common electrode, and the liquid crystal molecules are rotated to control the transmittance of the liquid crystal for each pixel.

Figure 5:
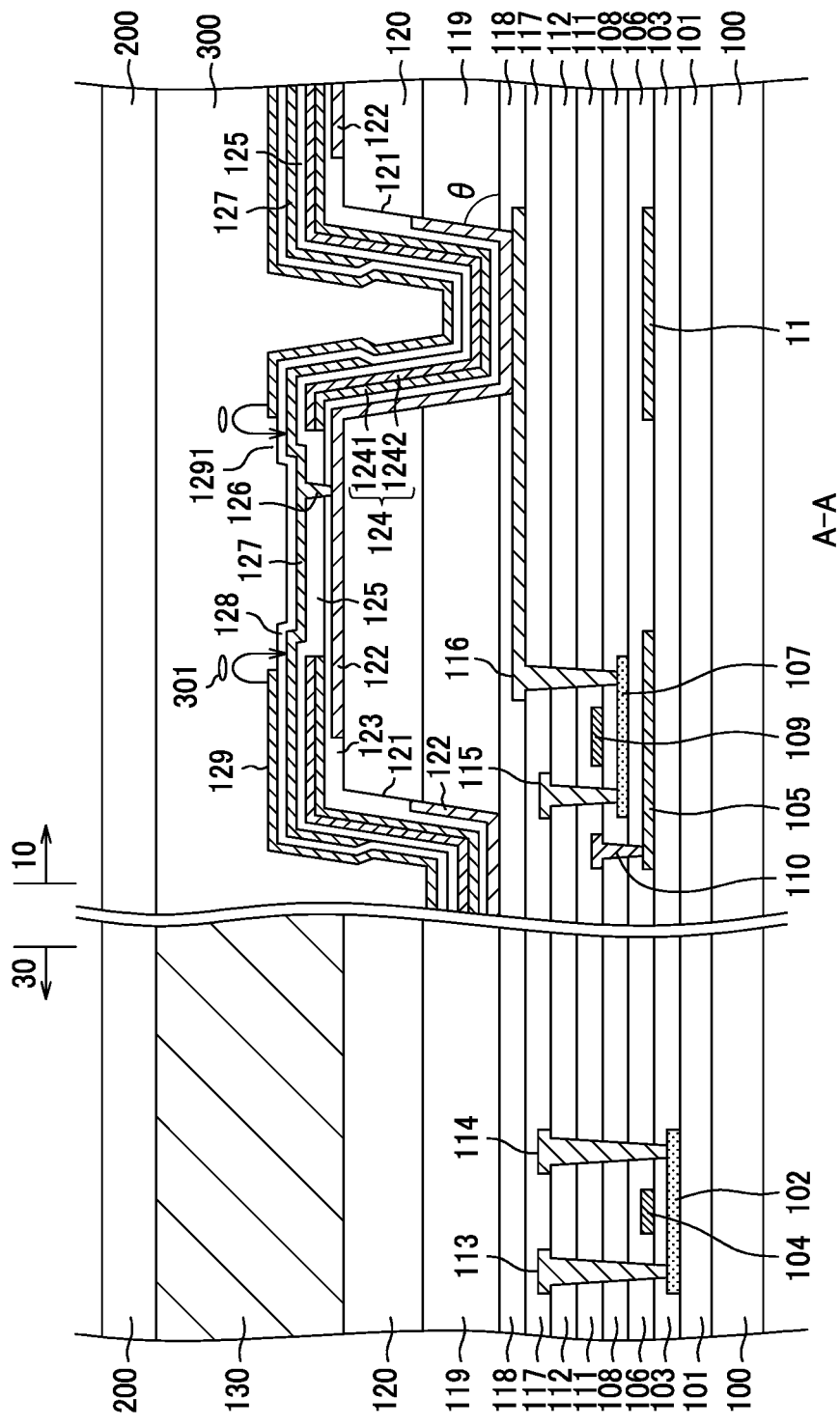
FIG. 5 is a cross sectional view of a comparative example.
Figure 11:
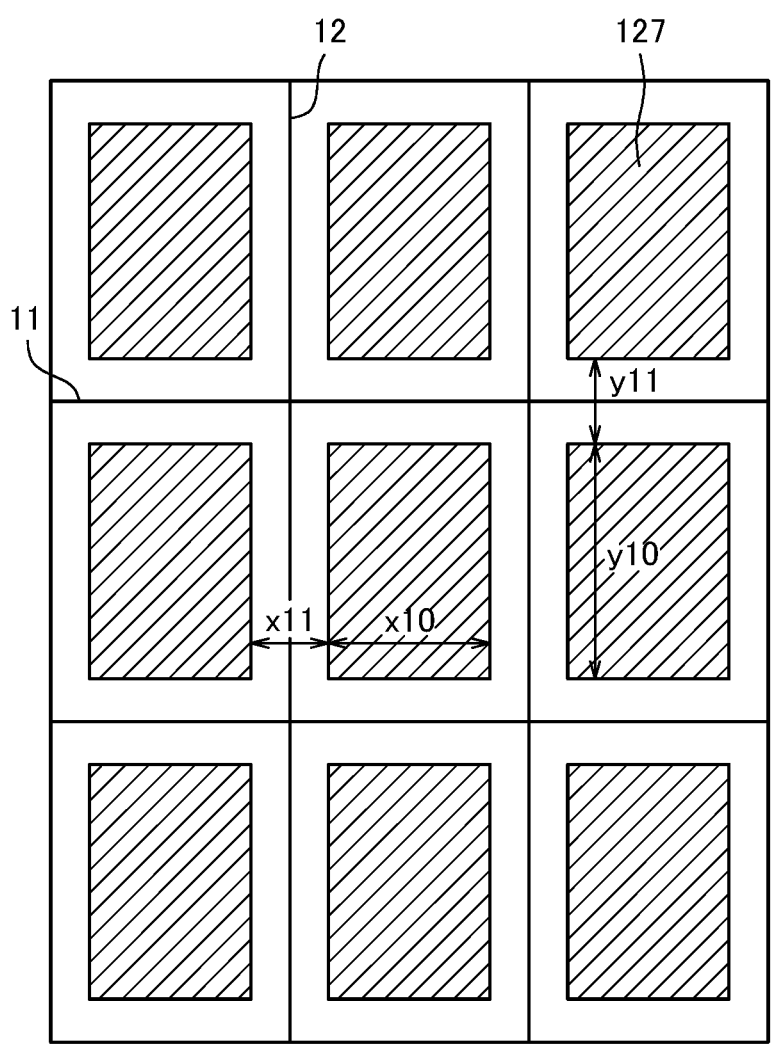
FIG. 11 is a photo mask pattern for the second pixel electrode.
Figure 12:
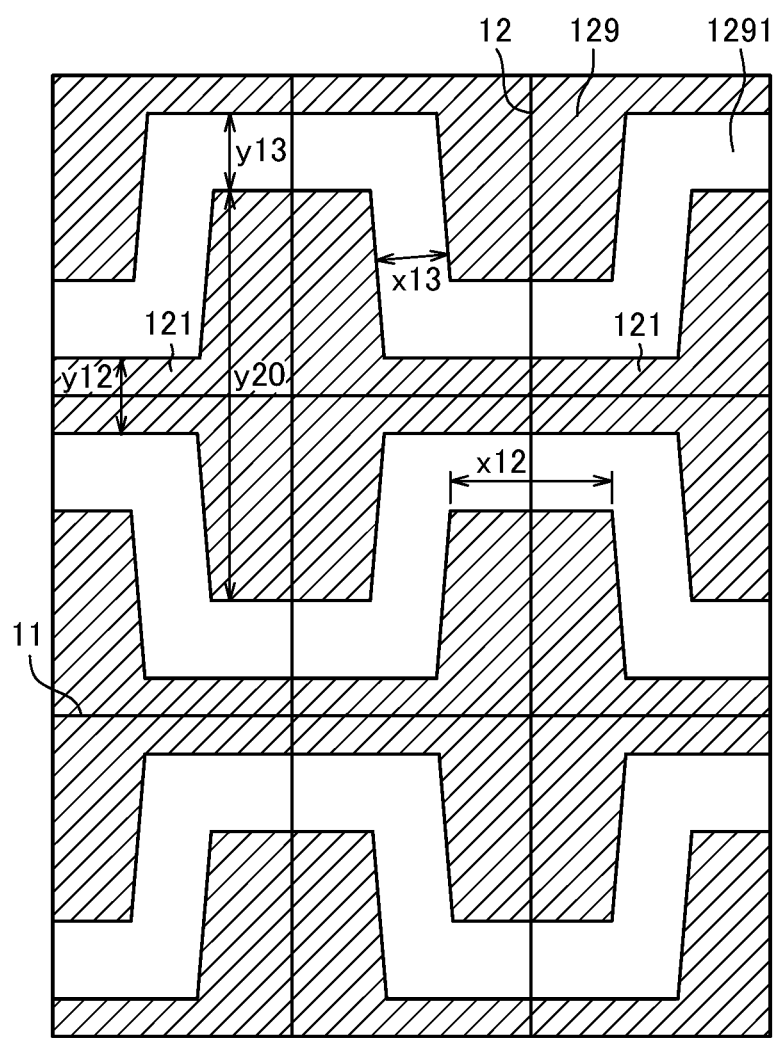
FIG. 12 is a photo mask pattern for the second common electrode.
Figure 13:
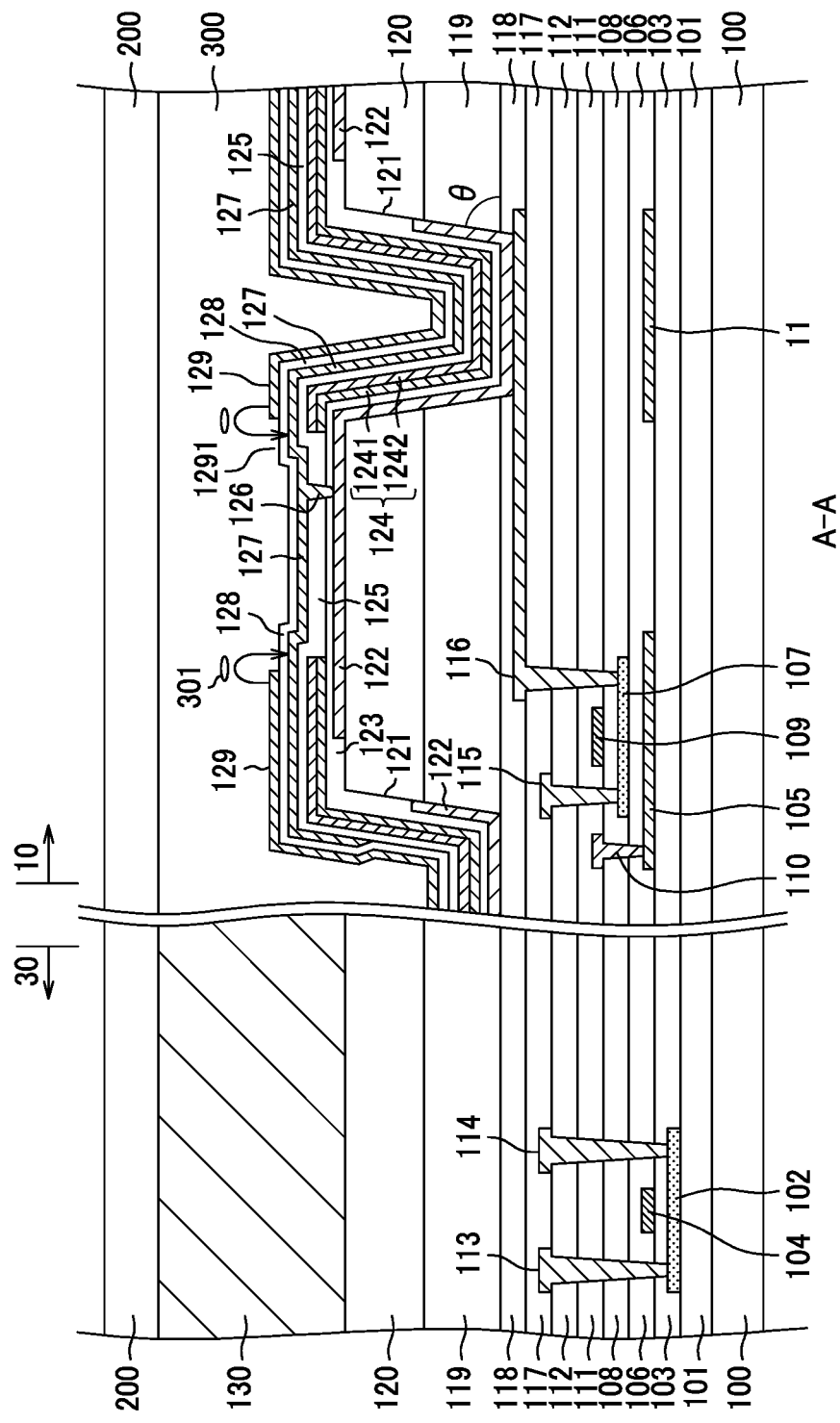
FIG. 13 is a cross sectional view which shows a problem of pixel structure of FIG. 5.

FIG. 5 is a cross sectional view showing a comparative example in which a small pixel, as described in FIG. 1, is configured without using the present embodiment. FIGS. 6 to 12 show examples of the process and the mask used for forming the configuration of FIG. 5. However, the arrangement of FIG. 5 has manufacturing problems as shown in FIG. 13. The configuration of the embodiment according to the present invention will be described later with reference to FIG. 14 and the following figures; however, as a premise thereof, the manufacturing process and the problem of the comparative example will be described with reference to FIGS. 5 to 13.

In FIG. 5, a left side is a sectional view showing a portion of a scanning line driving circuit 30 in which a polysilicon TFT is formed, and a right side is a sectional view of a display region 10 corresponding to a section A-A in FIG. 4. In the display region 10, an oxide semiconductor TFT is formed. The oxide semiconductor TFT is suitable as a switching TFT because a leakage current is smaller than that of a polysilicon TFT. Since the process temperature of the polysilicon TFT is higher than the process temperature of the oxide semiconductor TFT, a polysilicon TFT is formed first.

In FIG. 5, a base film 101 is formed on a TFT substrate 100 formed of glass or a resin such as polyimide. The base film 101 is formed of a stacked film of a silicon oxide film (hereinafter, also referred to as SiO film) and a silicon nitride film (hereinafter, also referred to as SiN film). The base film 101 is formed to prevent impurities from the glass substrate or the resin substrate from contaminating the semiconductor films 102 and 107.

A polysilicon film 102 for a polysilicon TFT is formed on the base film 101. The polysilicon film 102 is formed of a so-called low-temperature polysilicon in which an a-Si film is converted into polysilicon film using an excimer laser. A first gate insulating film 103, formed of, e.g., an SiN film, is formed covering the polysilicon film 102. A first gate electrode 104, formed of a metal or an alloy, is formed on the SiN film 103.

In the same layer in which the first gate electrode 104 for the polysilicon TFT is formed, a light shielding film 105 for the oxide semiconductor TFT is formed of the same material as that of the first gate electrode 104. In addition, a scanning line 11 is formed in the same layer and displaced at a portion corresponding to the first through hole 121, which is formed later. In some cases, the scanning line 11 and the light shielding film 105 are integrally formed. Note that the light-shielding film 105 may act as a gate electrode for an oxide semiconductor TFT or as a shield electrode for an oxide semiconductor TFT in some cases. The wiring 110 is a wiring for this purpose.

A first interlayer insulating film 106 is formed of an SiO film or the like covering the first gate electrode 104 and the light shielding film 105. When the first interlayer insulating film 106 is formed of two layers, the lower layer is an SiN film and the upper layer is an SiO film. An oxide semiconductor film 107 for an oxide semiconductor TFT is formed over the first interlayer insulating film 106. A second gate insulating film 108 is formed of an SiO film covering the oxide semiconductor film 107. A second gate electrode 109 is formed on the second gate insulating layer 108. A second interlayer insulating film 111 is formed of an SiO film covering the second gate electrode 109, and a third interlayer insulating film 112 is formed of the SiN film on the SiO film 111. A thickness of the second interlayer insulating film 111 is, e.g., 100 nm, and a thickness of the third interlayer insulating film 112 is, e.g., 200 nm.

A first inorganic passivation film 117 is formed by an SiO film to a thickness of 300 nm over the third interlayer insulating film 112, and a second inorganic passivation film 118 is formed thereon by an SiN film to a thickness of 100 nm. The protection by four layers of inorganic insulating films is to prevent impurities from the color filter 119 and the organic passivation film 120 to be formed later from contaminating the oxide semiconductor film 107.

In FIG. 5, a first drain electrode 113 is connected to a drain region of a polysilicon TFT in a scanning line driving circuit 30, and a first source electrode 114 is connected to a source region via a through hole. A second drain electrode 115 is connected to the drain region of the oxide semiconductor TFT in the display region 10, and a second source electrode 116 is connected to the source region. The second drain electrode 115 is connected to the video signal line 12, and the second source electrode 116 is connected to the first pixel electrode 122 via the first through hole 121.

The second drain electrode 115 is formed of a metal or an alloy, and the second source electrode 116 is formed of a transparent conductive film such as ITO (Indium Tin Oxide). Since the second source electrode 116 extends in the transmissive region of the pixel, the transparent conductive film is used for the second source electrode 116 so that the transmittance of the pixel is not reduced. Note that, unlike the second drain electrode 115, the first drain electrode 113, and the first source electrode 114, the second source electrode 116 extends over the first inorganic passivation film 117. This is for facilitating connection with the first pixel electrode 122.

In FIG. 5, a color filter 119 is formed on the second inorganic passivation film 118. In a conventional liquid crystal display device, a color filter is formed on the counter substrate 200, however, since the liquid crystal display device according to this embodiment has a small pixel pitch, it is intended to eliminate an error due to misalignment between the TFT substrate 100 and the counter substrate 200.

An organic passivation film 120 is formed on the color filter 119. Since the color filter 119 has a thickness of 1.5 to 2 μm and the organic passivation film 120 has a thickness of 2 to 3 μm, a combined thickness of the color filter 119 and the organic passivation film 120 is approximately 4 μm.

A first through hole 121 is formed in the color filter 119, the organic passivation film 120, and the second inorganic passivation film 118. As described above, since the total thickness of the color filter 119 and the organic passivation film 120 becomes about 4 μm, in order to reduce the diameter of the first through hole 121, it is necessary to make the taper angle θ of the inner wall of the first through hole 121 close to 90 degrees. Specifically, it is preferable that el is 70 to 90 degrees, more preferably 80 to 90 degrees. However, patterning the steep and deep through hole 121 is difficult. Note that this taper angle θ is measured at a central portion in the thickness direction of the color filter 119 or in a central portion in the thickness direction of the organic passivation film 120.

In FIG. 5, in order to increase the storage capacity, two layers of pixel electrodes 122 and 127 and two layers of common electrodes 124 and 129 are formed and are overlapped to each other. While the first pixel electrode 122, the second pixel electrode 127, and the second common electrode 129 are formed of ITO which is a transparent conductive film, the first common electrode 124 is formed of a laminated film of the ITO film 1241 and the metal or alloy such as the MoW alloy film 1242 so as to provide a light-shielding performance. Each of capacitance insulating films 123, 125, and 126 made of SiN film or the like is formed between each of the pixel electrodes 122 and 127 and the common electrodes 124 and 129. For example, the thickness of each ITO film is 50 nm, the thickness of the metal electrode 1242 constituting the first common electrode 124 is, for example, 50 nm, and the thickness of each of capacitance insulating films 123, 125, and 126 is, for example, 70 nm. The metal electrode 1242 is formed of metal or an alloy, and is hereinafter referred to as a metal electrode.

In FIG. 5, a first pixel electrode 122 is formed on an organic passivation film 120, and a first capacitance insulating film 123 is formed so as to cover it. The first pixel electrode 122 extends into the first through hole 121 and is connected to the source electrode 116 of the TFT. A first common electrode 124 is formed on the first capacitance insulating film 123. The first common electrode 124 is a stacked film of an ITO film 1241 and a MoW film 1242, and also has a light-shielding effect. The first common electrode 124 covers a large portion of the first through hole 121 and a large area of the organic passivation film 120. A transmissive region of a pixel is formed in an opening of the first common electrode 124.

A second capacitance insulating film 125 is formed covering the first common electrode 124. A second pixel electrode 127 is formed on the second capacitance insulating film 125. The second pixel electrode 127 is connected to the first pixel electrode 122 via a second through hole 126 formed in the second capacitance insulating film 125 and the first capacitance insulating film 123.

A third capacitance insulating film 128 is formed covering the second pixel electrode 127. A second common electrode 129 is formed on the third capacitance insulating film 128. The second common electrode 129 has a slit 1291. When a video signal is applied to the second pixel electrode 127, electric lines of force that pass through the liquid crystal layer 300 are generated between the second common electrode 129 and the second pixel electrode 127, thereby rotating the liquid crystal molecules 301 and controlling the transmittance of light in the pixel.

An alignment film is formed covering the second common electrode 129, but is omitted in FIG. 5. A counter substrate 200 formed of glass or a resin such as polyimide is disposed with the liquid crystal layer 300 interposed therebetween. An alignment film is also formed on the side of the counter substrate 200, but is omitted in FIG. 5. On the side of the scanning line driving circuit 30, a sealing material 130 is formed instead of a liquid crystal layer. The TFT substrate 100 and the counter substrate 200 are bonded to each other by the sealing material 130.

Figure 6:
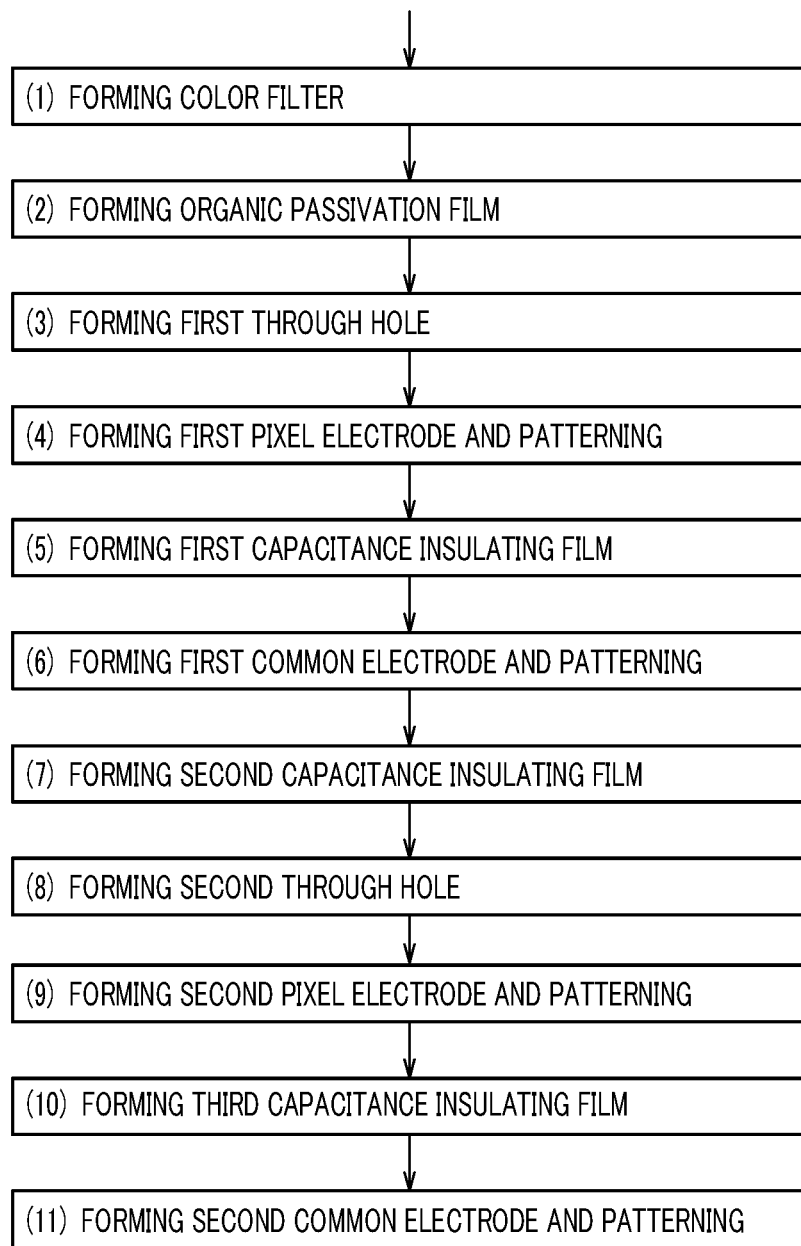
FIG. 6 is a process flow chart to form a structure of FIG. 5.
Figure 7:
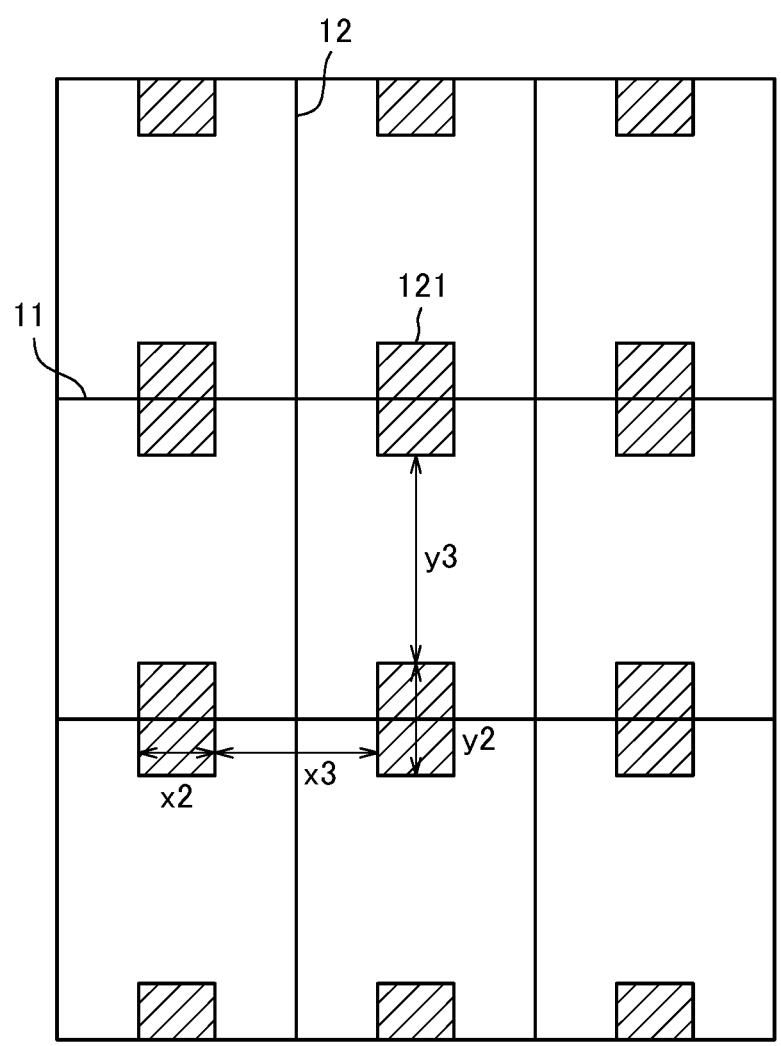
FIG. 7 is a photo mask pattern for the first through hole.

FIG. 6 is a process chart of the TFT substrate 100 after formation of the color filter 119 of FIG. 5, and FIGS. 7 to 12 are plan views showing the shapes of the photomasks corresponding to the respective photolithography processes. In FIGS. 7 to 12, a photomask pattern for 9 pixels is described. In FIGS. 7 to 12, a scanning line 11 extends in a horizontal direction, and a video signal line 12 extends in a vertical direction. A region surrounded by the scanning line 11 and the video signal line 12 is a pixel. The dimensions in FIGS. 7 to 12 are an example. Hereinafter, an explanation will be made in associating the process chart of FIG. 6 and FIGS. 7 through 12. In FIG. 6, (1) a color filter 119 is formed on a second inorganic passivation film, and (2) an organic passivation film 120 is formed thereon. Since a photosensitive resin is used for the color filter 119 and the organic passivation film 120, patterning can be performed without using a photoresist. For example, an acrylic resin is used for the organic passivation film 120. Next, (3) a first through hole 121 is formed through the second inorganic passivation film 118, the color filter 119, and the organic passivation film 120. FIG. 7 shows a pattern of the first through hole 121. The first through hole 121 is formed across the border of the vertically adjacent pixels. The dimensions shown below are the dimensions of the photomask. The dimension of the first through hole 121 is, for example, x2 is 2 μm and y2 is 3 μm. Since the vertical pitch of the pixel is 8.4 μm and the horizontal pitch is 6.3 μm, the interval y3 in the vertical direction between the first through holes 121 is 5.4 μm, and the interval x3 in the horizontal direction between the first through holes is 4.3 μm.

Figure 8:
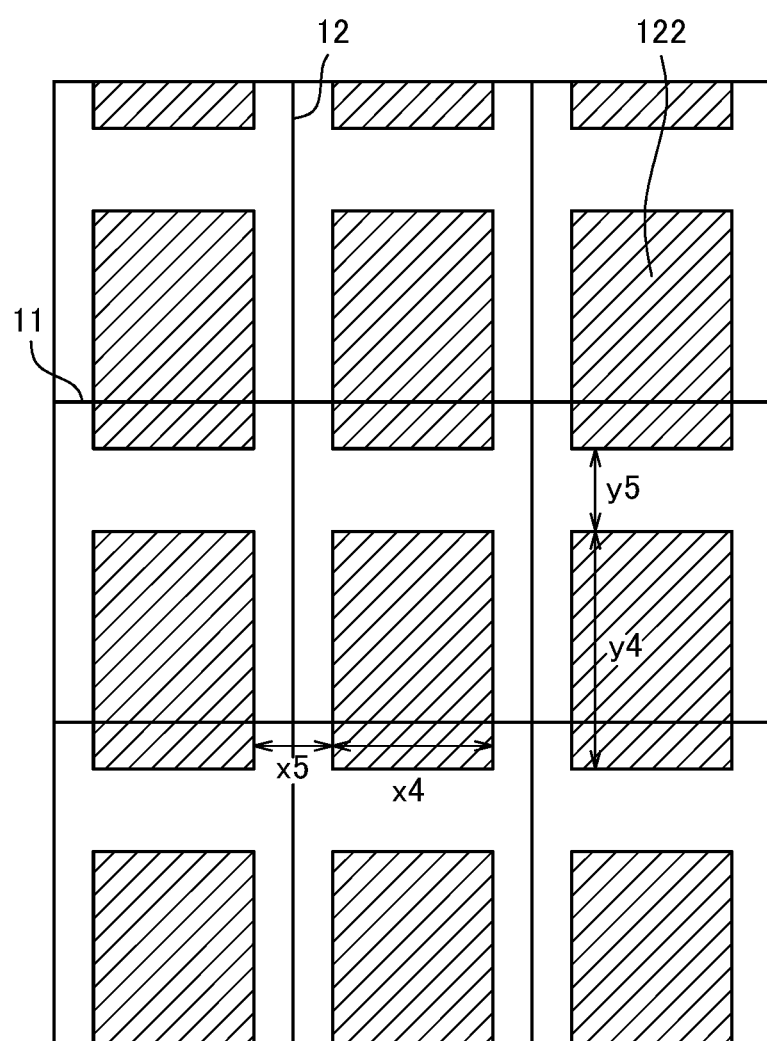
FIG. 8 is a photo mask pattern for the first pixel electrode.

Referring back to FIG. 6, (4) the first pixel electrode 122 is formed by ITO. A thickness of the first pixel electrode 122 is 50 nm. FIG. 8 is a photomask pattern of the first pixel electrode 122. The first pixel electrode 122 is formed so as to substantially cover the first through hole 121 and is formed in a rectangular shape so as to cover a large area of a pixel on an upper side in the y direction of the first through hole 121. In the first pixel electrode 122, the lateral dimension x4 s 4.3 μm, and the lateral interval x5 is 2 μm. In addition, the dimension y4 in the vertical direction is 6.4 μm, and the interval y5 in the vertical direction is 2 μm.

Referring back to FIG. 6, (5) the first capacitance insulating film 123 is formed to a thickness of 70 nm by SiN. (6) A first common electrode 124 is formed on the first capacitance insulating film 123. The first common electrode 124 is a stacked film of an ITO film 1241 having a thickness of 50 nm and a MoW film 1242 having a thickness of 50 nm. In other words, the first common electrode 124 serves as a light shielding film. A hole portion formed in the first common electrode 124 transmits light.

Figure 9:
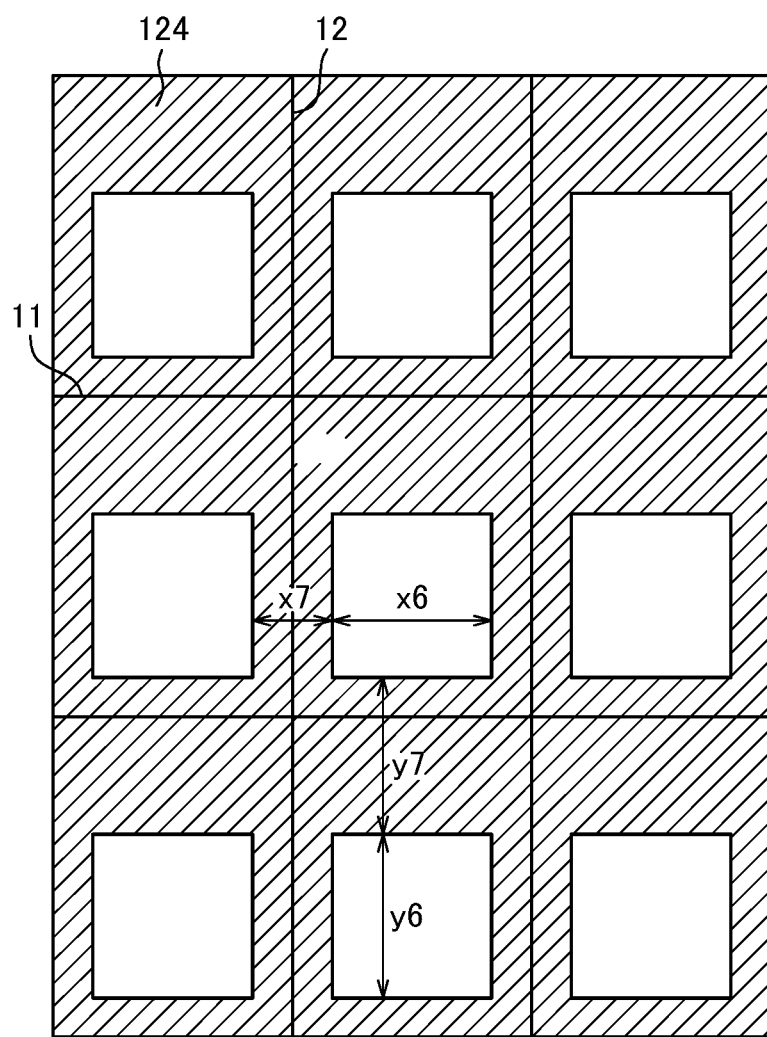
FIG. 9 is a photo mask pattern for the first common electrode.

FIG. 9 is a photomask pattern of the first common electrode 124. The first common electrode 124 is formed in common to each pixel, but holes are formed in each pixel. Light for forming an image is transmitted through this hole. The dimension x6 of the hole formed in the first common electrode 124 in the lateral direction is 4.3 μm, and the interval x7 in the lateral direction is 2 μm. In addition, the dimension y6 of the hole in the vertical direction is 4.3 μm, and the interval y7 in the vertical direction is 4.1 μm.

Figure 10:
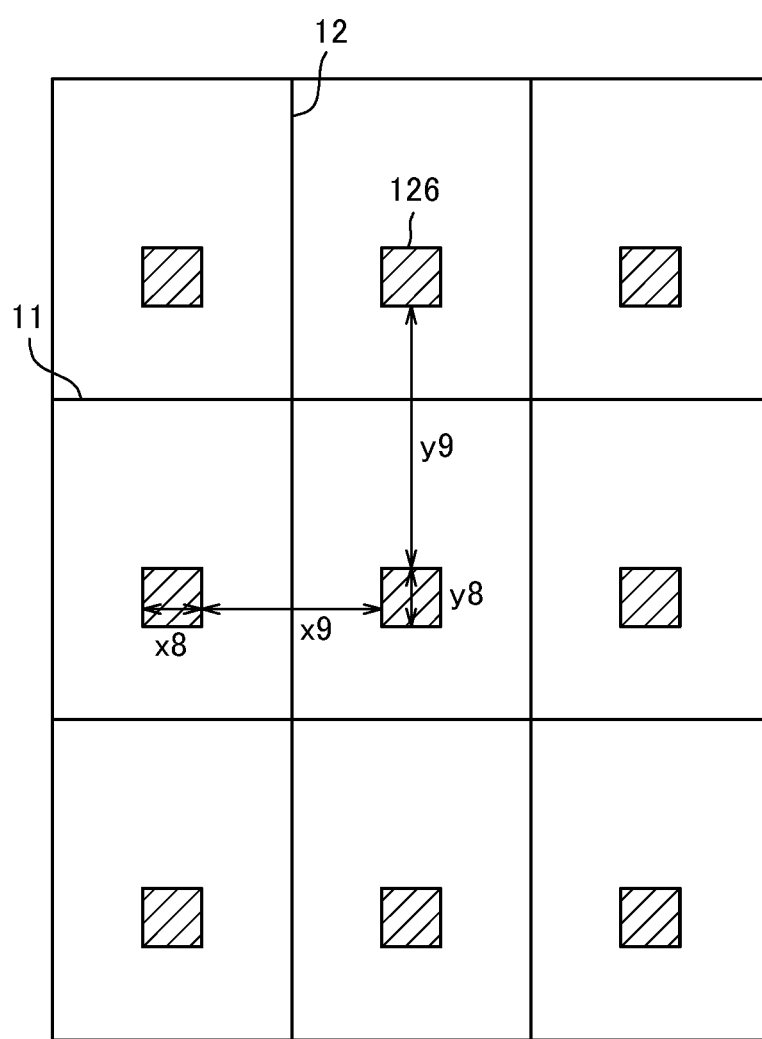
FIG. 10 is a photo mask pattern for the second through hole.

Referring back to FIG. 6, (7) the second capacitance insulating film 125 is formed to a thickness of 50 nm by SiN covering the first common electrode 124. (8) Thereafter, in order to connect the first pixel electrode 122 and the second pixel electrode 127 to each other, a second through hole 126 is formed through the first capacitance insulating film 123 and the second capacitance insulating film 125. FIG. 10 is a photomask pattern of the second through hole 126. In FIG. 10, the lateral dimension x8 of the second through-hole 126 is 1.5 μm, and the lateral interval x9 is 4.8 μm. In addition, the dimension y8 in the vertical direction is 1.5 μm, and the interval y9 in the vertical direction is 6.9 μm.

Referring back to FIG. 6, (9) the second pixel electrode 127 is formed to a thickness of 50 nm by using ITO covering the second capacitance insulating film 125 and the second through hole 126. FIG. 11 is a photomask pattern of the second pixel electrode 127. The second pixel electrode 127 is formed in a rectangular shape in the pixel. The dimension x2 in the lateral direction of the second pixel electrode 127 is 4.3 μm, and the interval x11 in the lateral direction is 2 μm. In addition, the dimension y10 in the vertical direction is 6.4 μm, and the interval y11 in the vertical direction is 2 μm.

Referring back to FIG. 6, (10) the third capacitance insulating film 128 is formed to a thickness of 70 nm by SiN covering the second pixel electrode 127. Then (11) the second common electrode 129 is formed to a thickness of 50 nm by ITO. FIG. 12 is a photomask pattern of the second common electrode 129. The second common electrode 129 is formed in common to each pixel. Further, a slit 1291 is formed continuously in the second common electrode 129.

In FIG. 12, in the second common electrode 129, the wide portion y20 is 10.8 μm and the narrow portion y 12 is 2 μm. The width x12 of the tip portion of the second common electrode 129 is 4.1 μm, and the portion x13 having the narrowest interval in the x direction is 1.94 μm. In other words, the width of the slit 1291 is 1.94 to 2 μm.

When a potential difference is generated between the second common electrode 129 and the second pixel electrode 127, electric lines of force passing through the liquid crystal layer 300 from the second common electrode 129 through the slit 1291 toward the second pixel electrode 127 are generated; consequently, electric lines of force rotate the liquid crystal molecules 301 to control the transmittance of the liquid crystal layer 300. In other words, the control of the transmittance of the liquid crystal for image formation is performed between the second common electrode 129 and the second pixel electrode 127, and the first pixel electrode 122 and the first common electrode 124 are used as the pixel capacitance or as a light shielding film.

The liquid crystal display device shown in FIG. 5 has the following problems. That is to say, the first through hole 121 formed in the organic passivation film 120, the color filter 119, and the second inorganic passivation film 118 are deep and steep. Therefore, it is difficult to control the photoresist in the first through hole 121, and accurate patterning becomes difficult.

In particular, ends of the adjacent second pixel electrodes 127 in the adjacent pixels are disposed opposite to each other at the first through-hole 121. If patterning of photoresist cannot be performed correctly, there tend to arise a defect as that adjacently located two second pixel electrodes 127 cannot be separated and are left continuous. This state is shown in FIG. 13.

FIG. 13 is the same as FIG. 5 except for the shape of the second pixel electrode 127 in the first through hole 121. In FIG. 13, the second pixel electrodes 127 are not separated in the first through hole 121 and become a continuous film. In other words, it is impossible to control the transmittance of the liquid crystal layer 300 for each pixel.

To eliminate this phenomenon, it is conceivable to form the second pixel electrode 127 so as not to be applied to the end of the first through hole 121. However, when the area of the second pixel electrode 127 is reduced, the control region by the liquid crystal is reduced, and the transmittance of the pixel is reduced.

Figure 14:
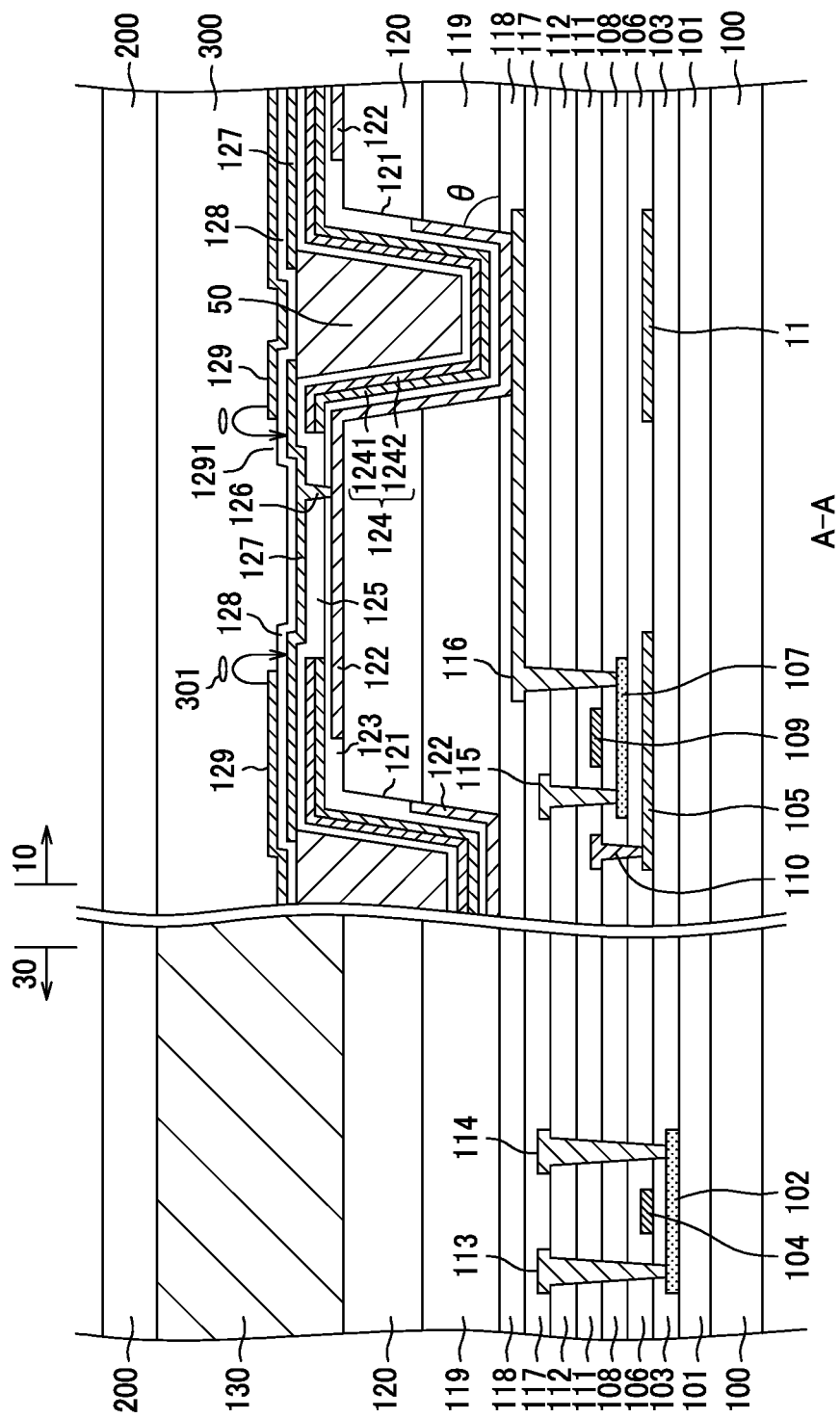
FIG. 14 is a cross sectional view of the structure according to embodiment 1.

FIG. 14 is a cross sectional view showing the configuration of Embodiment 1 in which the above problem is counter measured. FIG. 14 is the same as FIG. 5 except for the structure of inside of the first through hole 121 and the upper structure of the first through hole 121. In FIG. 14, the inside of the first through hole 121 is filled with an organic material 50. As in the case of the organic passivation film 120, a photosensitive resin is used as the filler 50. However, since the filler 50 is patterned by the entire exposure, it is desirable to use a material having a lower photosensitivity than that of the organic passivation film 120.

Figure 15:
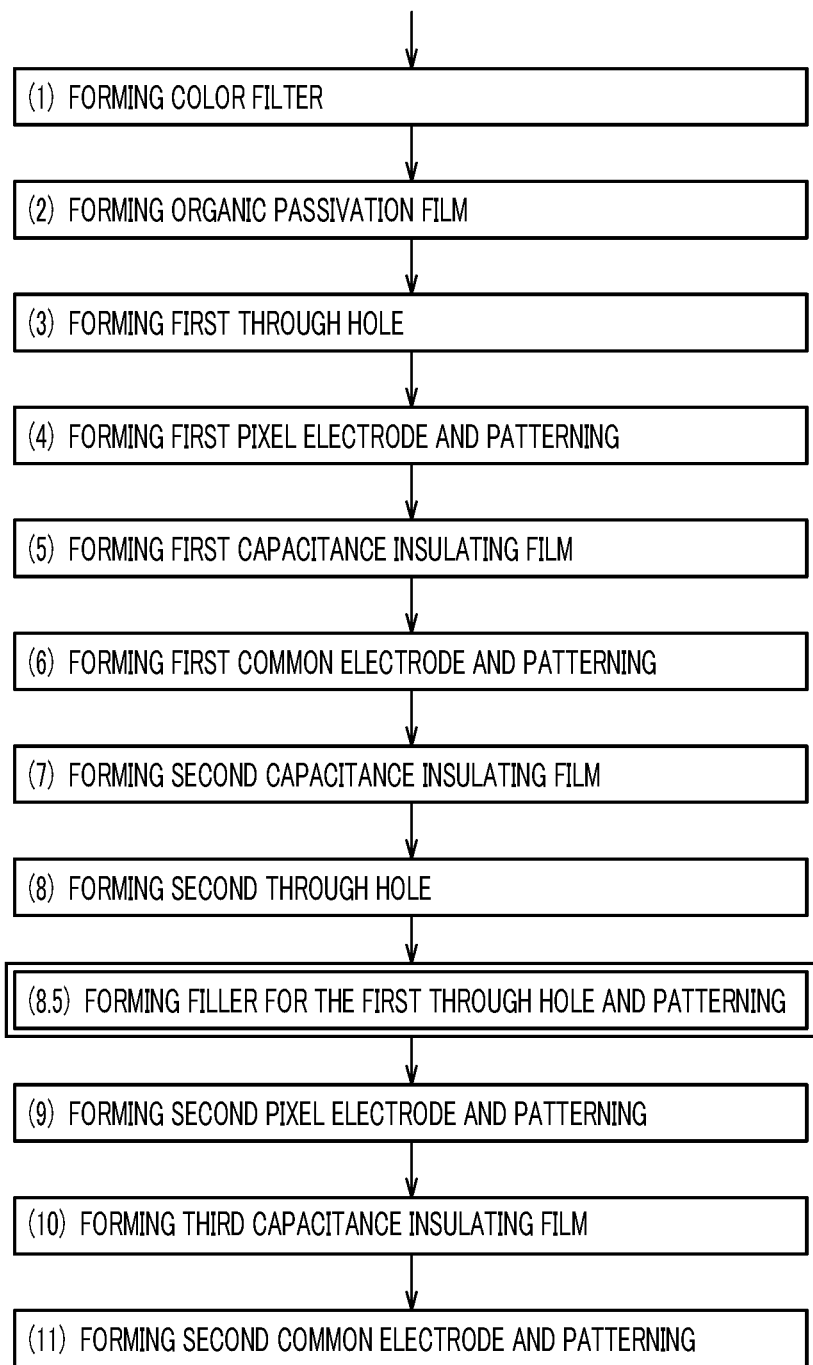
FIG. 15 is a process flow chart to realize the structure of FIG. 14.

FIG. 15 is a process chart for realizing the configuration of FIG. 14. FIG. 15 is different from FIG. 6 in that (8.5) the first through hole 121 is filled with the filler 50 made of an organic material after (8) the second through hole 126 is formed in the first capacitance insulating film 123 and the second capacitance insulating film 125. Subsequent steps are the same as in FIG. 6. In contrast to FIG. 15, the second through-hole 126 may be formed after the filling material 50 is formed in the first through-hole 121.

Figure 16:
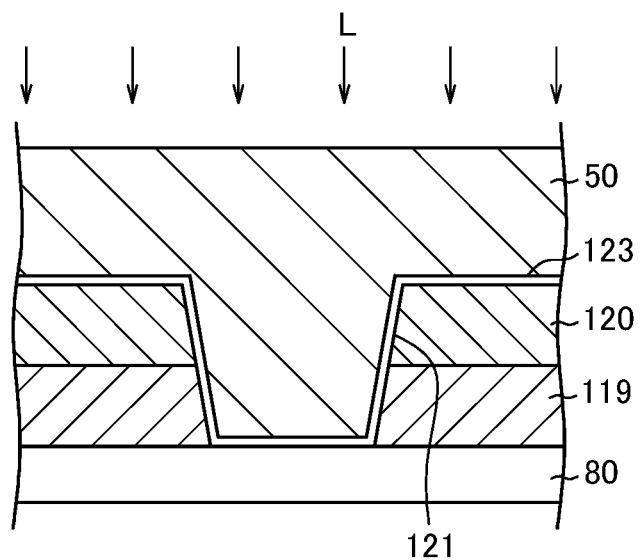
FIG. 16 is a cross sectional view in which a material of filler is coated on a first capacitance insulating film.
Figure 17:
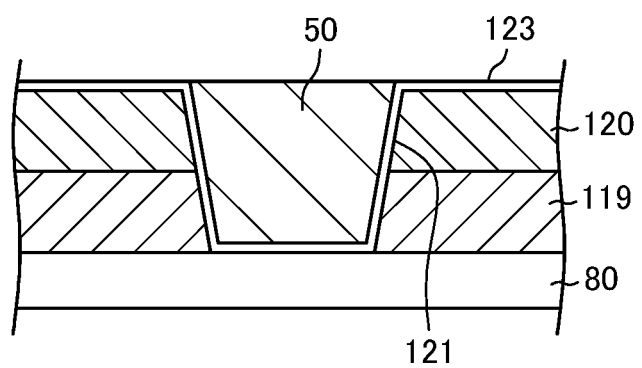
FIG. 17 is a cross sectional view in which the first through hole is filled with the filler.

FIGS. 16 and 17 are cross sectional views showing a process of forming a filler 50 in the first through-hole 121. In FIG. 16, reference numeral 80 denotes a TFT circuit layer, which is a generic term of a layer formed below the color filter 119. A color filter 119 and an organic passivation film 120 are formed on the TFT circuit layer 80, and a first through hole 121 is formed in the color filter 119 and the organic passivation film 120. In the first through hole 121, a first capacitance insulating film 123 is formed covering an inner wall of the organic passivation film 120 and the color filter 119. Other layers are omitted in FIG. 16.

In FIG. 16, an organic material 50 is coated, and the organic material 50 is temporarily baked by prebaking. In this state, the entire surface of the organic material 50 is exposed. An arrow L in FIG. 16 represents light. The exposed portion becomes more soluble in the developer. Since the organic material 50 in the first through hole 121 is not sufficiently exposed, it is hardly soluble in the developer. Thus, as shown in FIG. 17, after development, the filler material 50 remains in the first through hole 121. Thereafter, a post-bake is performed to bake the filler 50.

As in the case of the organic passivation film 120, a photosensitive acrylic resin can be used as the organic material as the filler 50, but it is desirable to use a material having a low photosensitivity for the filler 50. This is because the filling material 50 is left only in the first through-hole 121 by performing the entire exposure.

Figure 18:
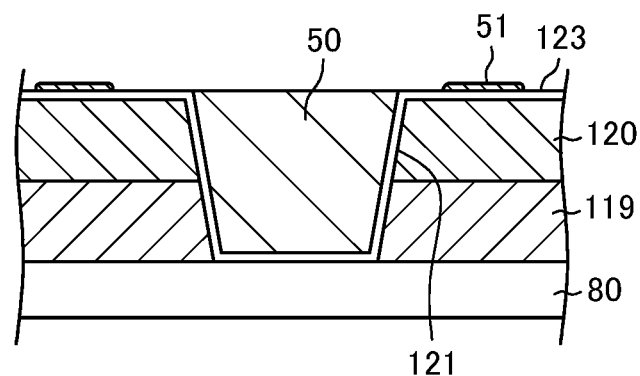
FIG. 18 is a cross sectional view in which the residual of the filler is remained outside of the first through hole.
Figure 19:
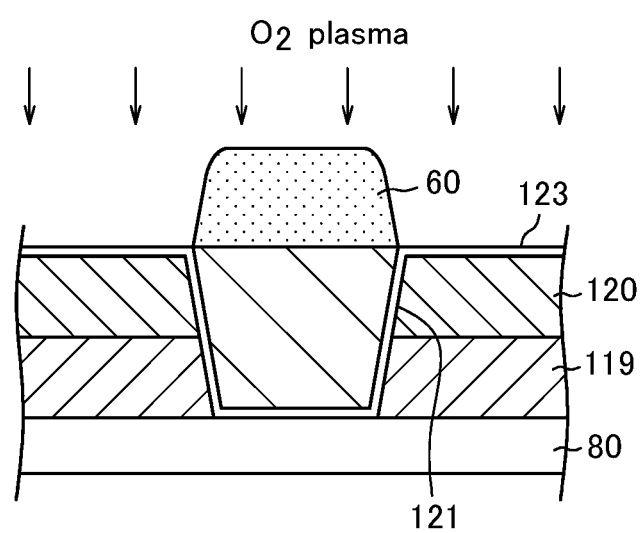
FIG. 19 is a cross sectional view in which the residual of the filler outside of the first through hole is being removed.

However, as shown in FIG. 18, a residue 51 of the filling material 50 tends to remain other than in the first through-hole 121. To prevent this, for example, as shown in FIG. 19, after filling the first through hole 121 with organic material 50, resist 60 is formed covering the first through hole 121. Thereafter, the residue 51 of the filler material, other than the one in the first through hole 121, is removed by an oxygen plasma ashing.

Figure 20:
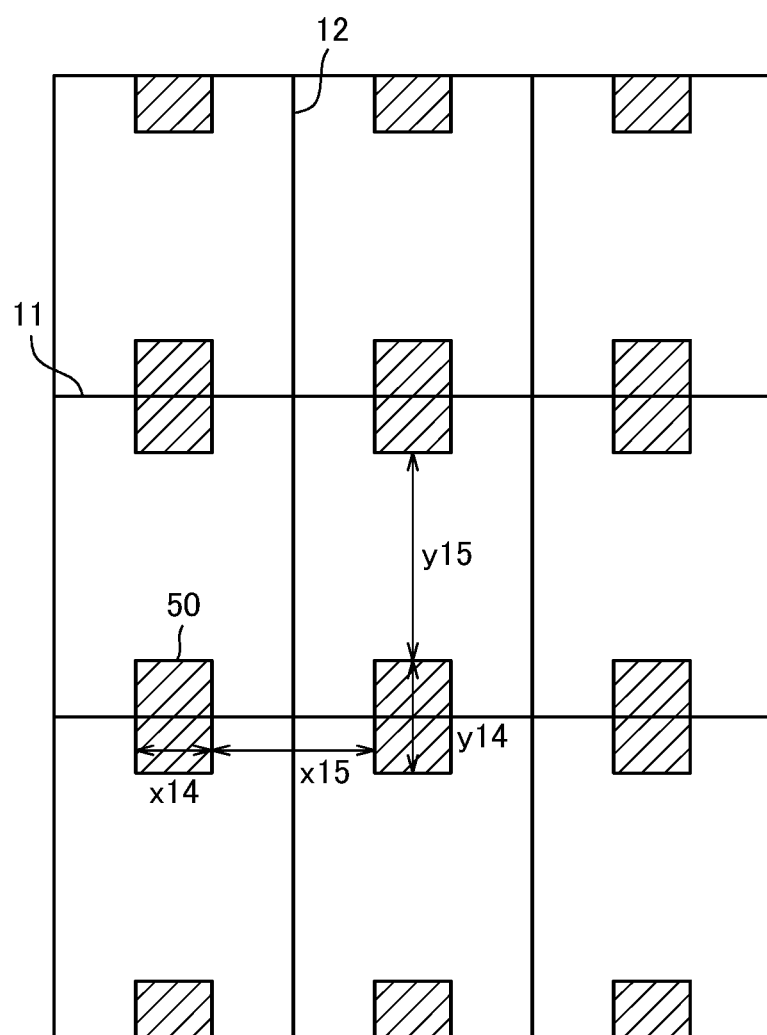
FIG. 20 is a photo mask pattern for the resist of FIG. 19.

FIG. 20 is an example of a photomask for forming a resist 60. The pattern of FIG. 20 is identical to the photomask pattern for the first through hole 121 of FIG. 7. In FIG. 20, the dimension x14 in the x direction of the pattern 50 for the filler 50 is 2 μm, the interval x15 in the x direction is 4.3 μm, the dimension y14 in the y direction is 3 μm, and the interval y15 in the y direction is 5.4 μm.

Figure 21:
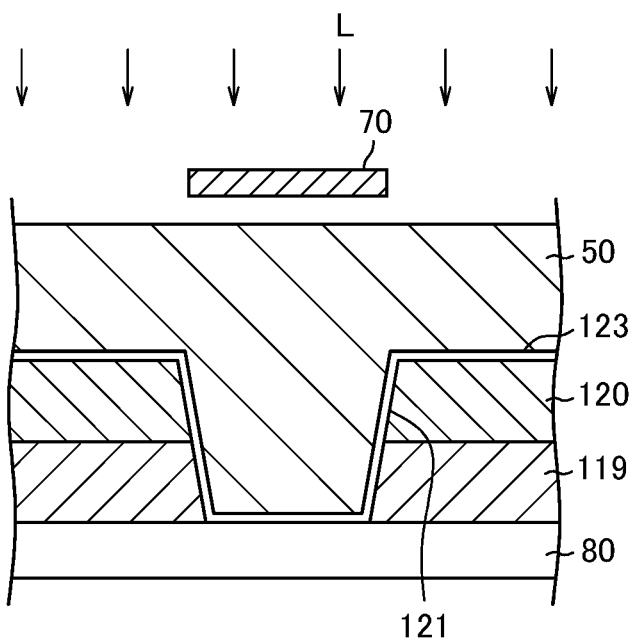
FIG. 21 is a cross sectional view in which exposure is being performed using a half exposure mask.

Another method of preventing residue 51 of filler 50 is to expose organic material using a half exposure mask 70, as shown in FIG. 21. By using the half exposure mask 70 in the portion corresponding to the first through hole 121, the organic material 50, other than the one in the first through hole 121, is exposed more strongly, so that the residue 51 of the organic material can be prevented. The shape of the half exposure mask pattern is the same as in FIG. 20. According to the method of FIG. 21, the photolithography process can be omitted compared with the method of FIG. 19.

Figure 22:
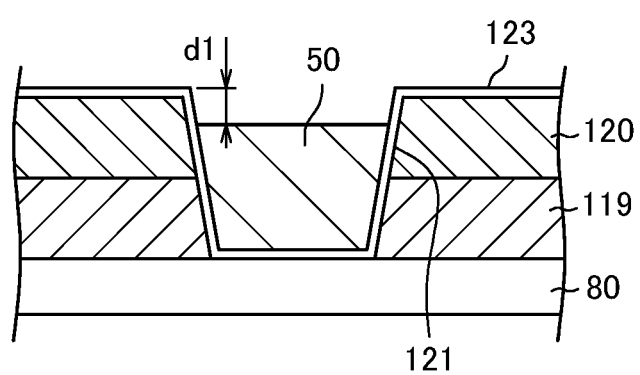
FIG. 22 is a cross sectional view of another example of embodiment 1.

In the meantime, the surface of the filler 50 formed in the first through hole 121 need not be completely flush with the other surface. As shown in FIG. 22, even if the surface of the filling material 50 is lower than the other surface by, for example, d1, it is acceptable as far as the patterning of the second pixel electrode 127 can be accurately performed. The step d1 shown in FIG. 22 can be controlled by an exposure amount for the entire exposure as shown in FIG. 16. In other words, as the exposure amount increases, d1 of FIG. 22 increases. According to the method of FIG. 22, it is not necessary to use a photolithography process, a half exposure mask, or the like, therefore, this method is advantageous in terms of cost.

Figure 23:
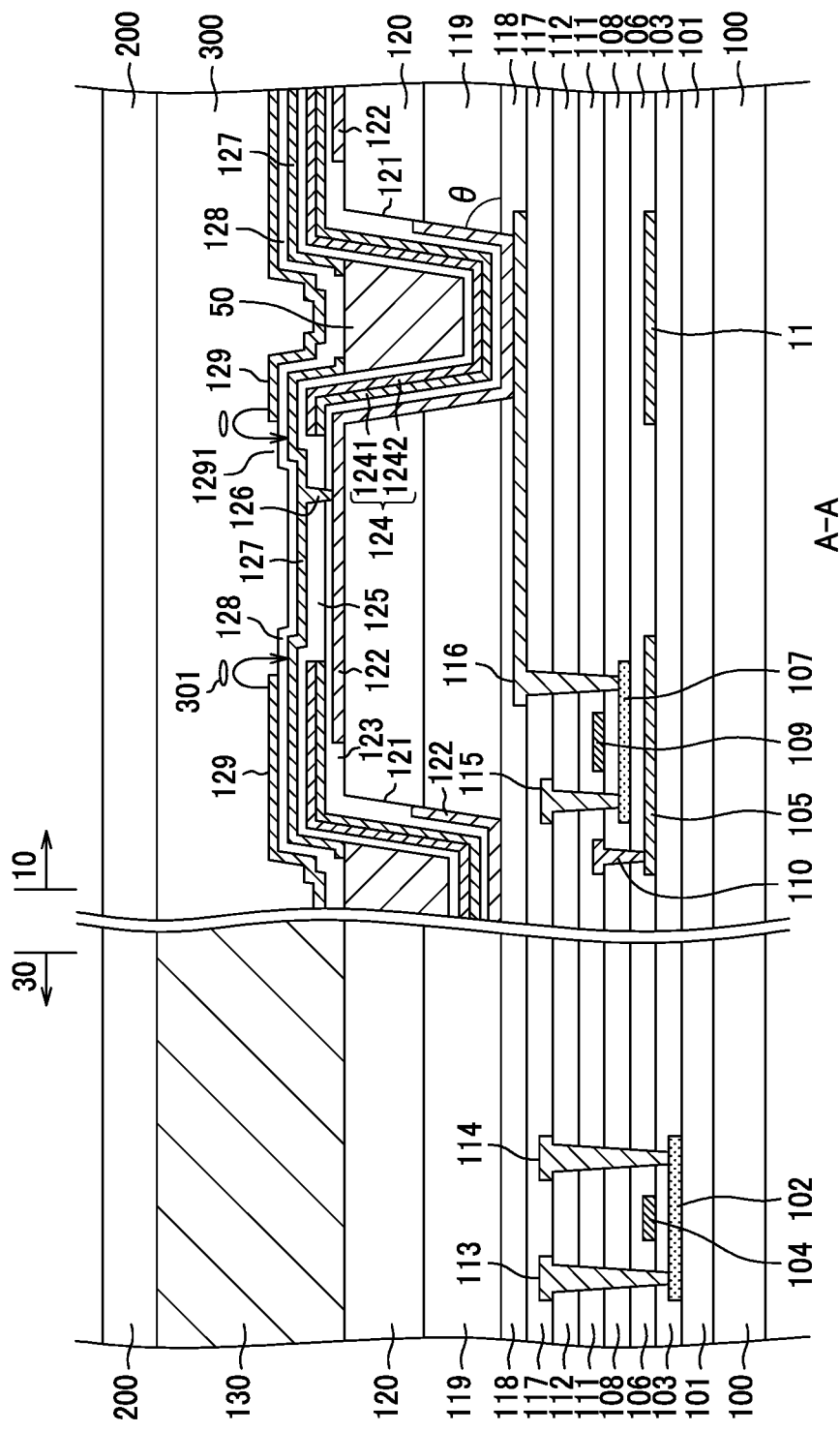
FIG. 23 is a precise cross sectional view of another example of embodiment 1.

FIG. 23 is a cross sectional view showing the configuration of Embodiment 1 using the method of FIG. 22. FIG. 23 is similar to FIG. 14 except for an upper surface portion of the filling material 50 formed in the first through hole 121.

In FIG. 23, the upper surface of the filler 50 is lower than that of the other portions. The second pixel electrode 127 is patterned on the filling material 50 in the first through hole 121.

Although a step is formed in the second pixel electrode 127, this step is much smaller than the depth of the first through hole 121. This step is controlled to such an extent that a break down at the step in the second pixel electrode 127 does not occur and the second pixel electrode 127 can be accurately patterned.

As described above, by using the configuration of Embodiment 1, it is possible to precisely pattern the second pixel electrode 127, and to manufacture a high definition display device with high yield.

In the above description, the liquid crystal display device of the so-called IPS (In Plane Switching) type has been described, but this is an example; the present invention can be applied to other types of liquid crystal display devices.

Embodiment 2

In the liquid crystal display device, it is necessary to maintain a constant thickness of the liquid crystal layer 300, i.e., an interval between the TFT substrate 100 and the counter substrate 200. To this end, a columnar spacer 150 is generally used. In a conventional liquid crystal display device, a columnar spacer 150 is often formed on a counter substrate 200; however, in an ultra high definition display device as shown in FIG. 1, since the alignment accuracy of the TFT substrate 100 and the counter substrate 200 becomes a problem, therefore, the columnar spacers 150 are formed on the side of the TFT substrate 100. The columnar spacers 150 are arranged at intervals of a plurality of pixels.

Figure 24:
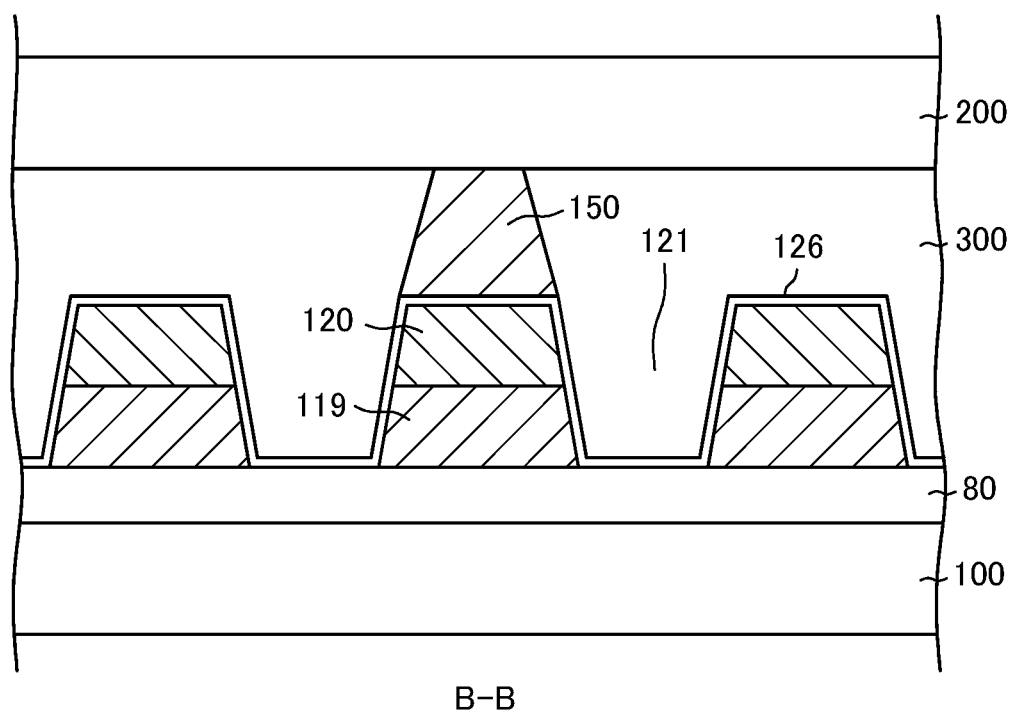
FIG. 24 is a cross sectional view in which a columnar spacer is disposed in relation with embodiment 2.
Figure 25:
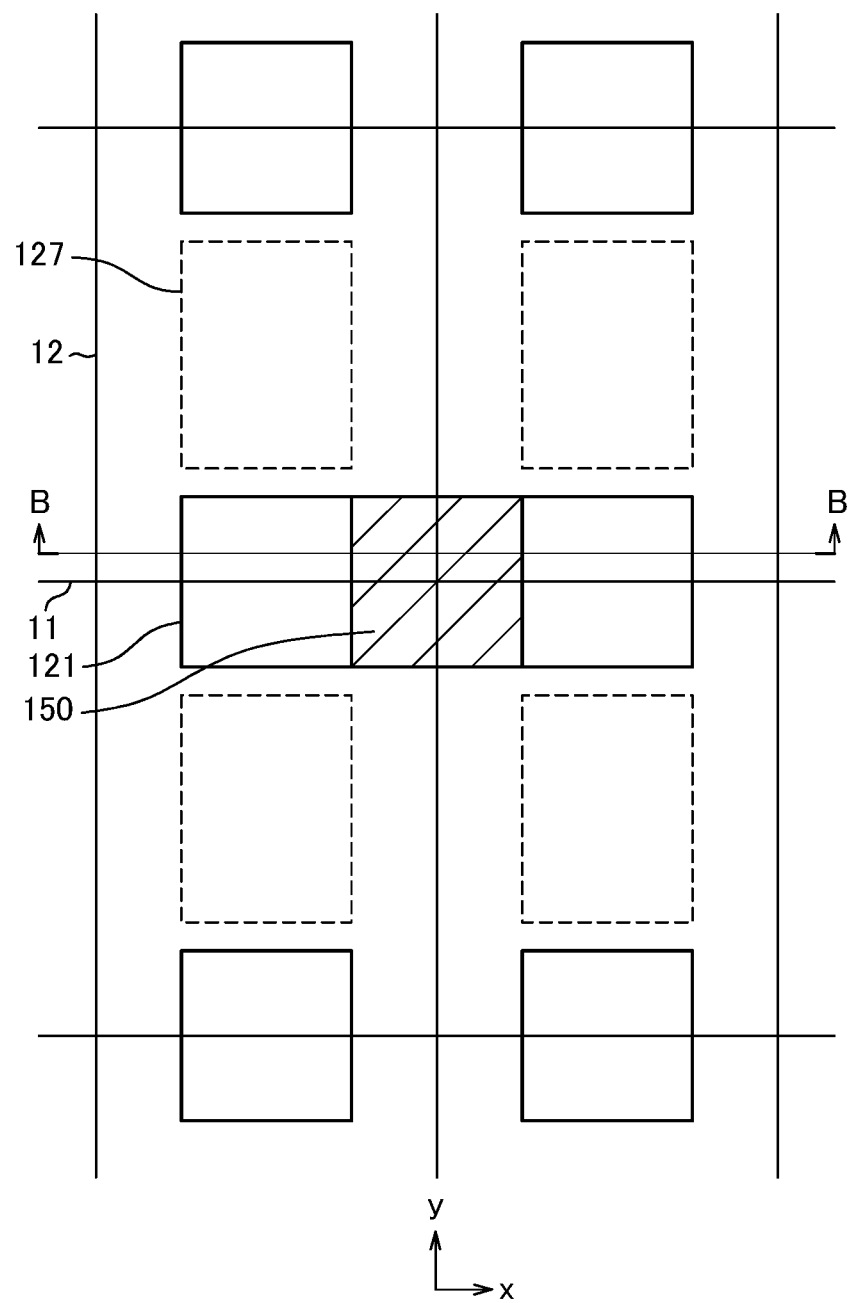
FIG. 25 is a plan view in which a columnar spacer is disposed.

FIG. 24 is a cross sectional view of a pixel at a portion where the columnar spacer 150 is disposed. In FIG. 24, an interval between the TFT substrate 100 and the counter substrate 200 is maintained by a columnar spacer 150. FIG. 25 is a plan view of a pixel at a portion where the columnar spacer 150 is disposed. In FIG. 25, a portion indicated by a dotted line is a second pixel electrode 127, and a transmissive region of a pixel is formed in a part of this portion. FIG. 24 is a cross sectional view corresponding to a section B-B of FIG. 25. In FIGS. 24 and 25, the size of the columnar spacer 150 and the first through-hole 121 in the x-direction is equal to each other, and is, for example, 3.15 μm. In other words, the space in which the columnar spacer 151 can be arranged is very small.

Figure 26:
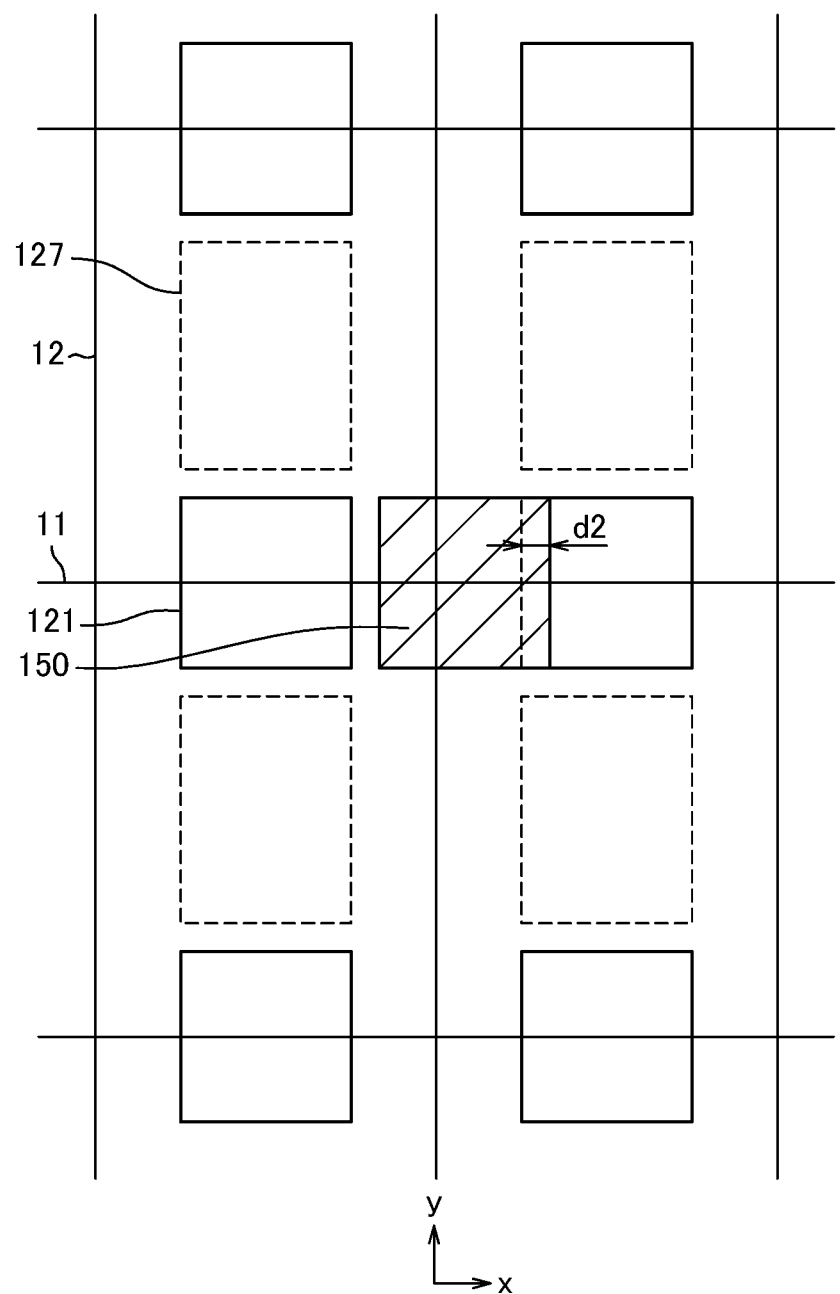
FIG. 26 is a plan view in which a columnar spacer is deviated from an aligned position.
Figure 27:
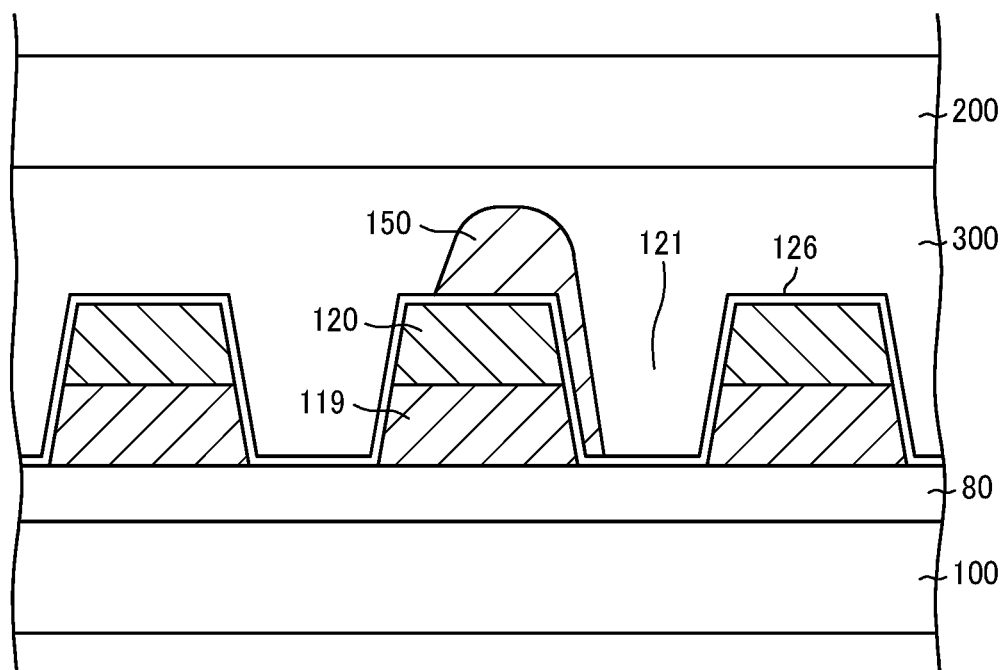
FIG. 27 is a cross sectional view to show a problem when a columnar spacer is deviated from an aligned position.

FIG. 26 is a plan view of a case where the position of the columnar spacer 150 is shifted in the x-direction by d2, for example, about 0.5 μm due to manufacturing error. Even if the columnar spacer 150 is slightly displaced in this way, the columnar spacer 150 falls into the first through-hole 121. FIG. 27 is a cross sectional view showing this state. In FIG. 27, as a result of the columnar spacer 150 falling into the first through hole 121, the height of the columnar spacer 150 becomes low, and it becomes impossible to maintain an accurate interval between the TFT substrate 100 and the counter substrate 200.

Figure 28:
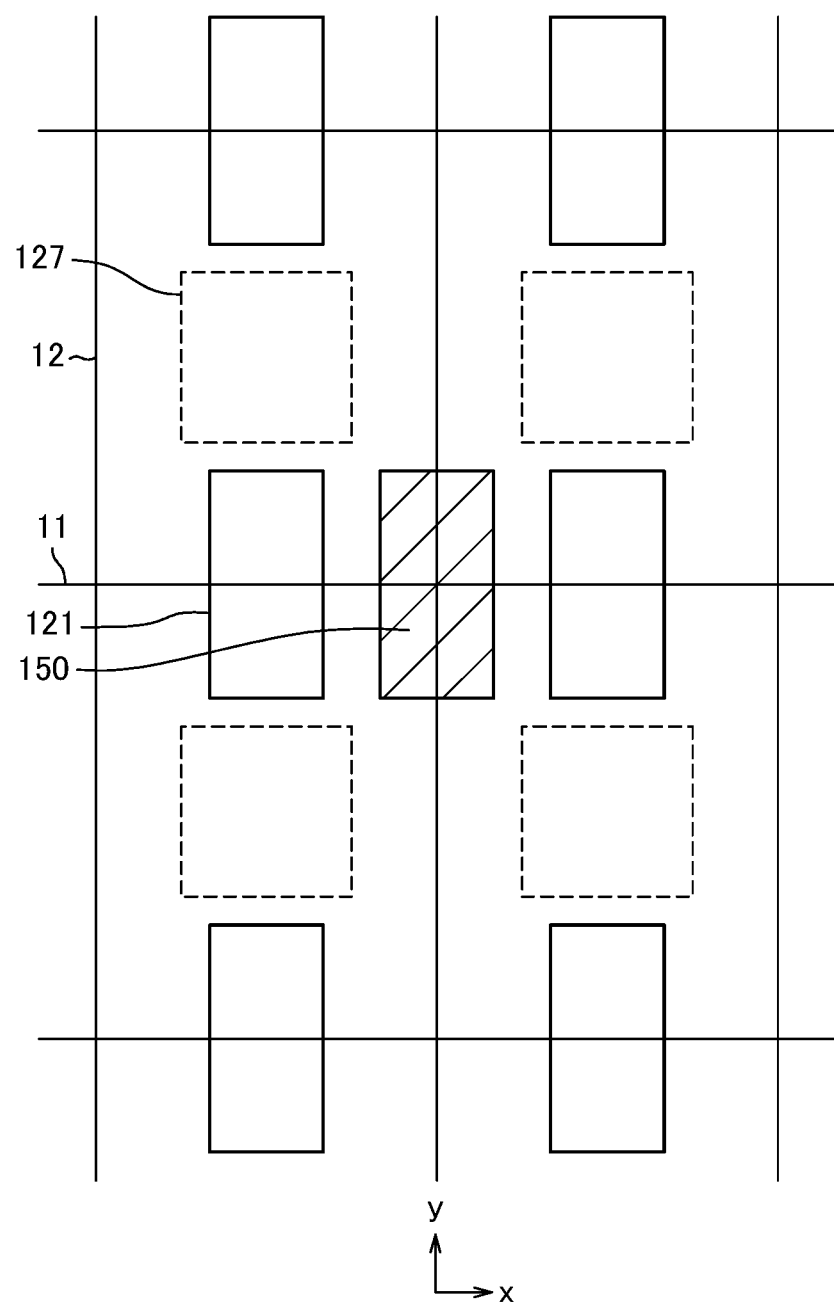
FIG. 28 is a plan view of the columnar spacer and the first through hole to prevent leaning of the columnar spacer.

FIG. 28 is a plan view of a case in which the planar shape of the first through hole 121 and the columnar spacer 150 is vertically elongated so that the columnar spacer 150 does not fall into the first through hole 121, and the tolerance to displacement of the columnar spacer 150 is increased. However, in this case, the area of the second pixel electrode 127 indicated by a dotted line becomes small, and the transmittance of the pixel decreases.

Figure 29:
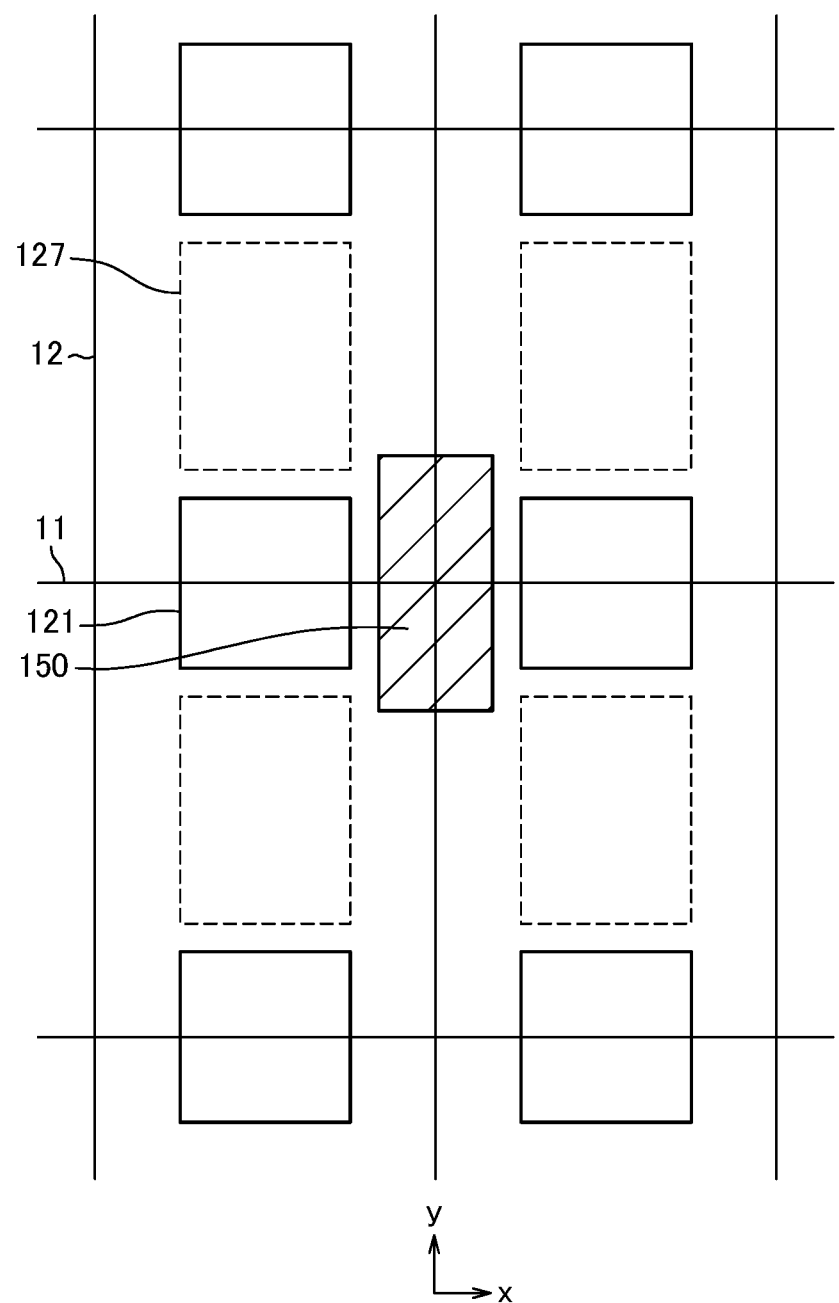
FIG. 29 is a plan view of the columnar spacer and the first through hole in another structure to prevent leaning of the columnar spacer.

FIG. 29 is a plan view of a case in which the shape of the first through hole 121 is not changed and only the columnar spacer 150 is vertically elongated. In this case, although the area of the second pixel electrode 127 can be maintained, interference between the columnar spacer 150 and the second pixel electrode 127 easily occurs because the distance between the columnar spacer 150 and the second pixel electrode 127 becomes small.

Figure 30:
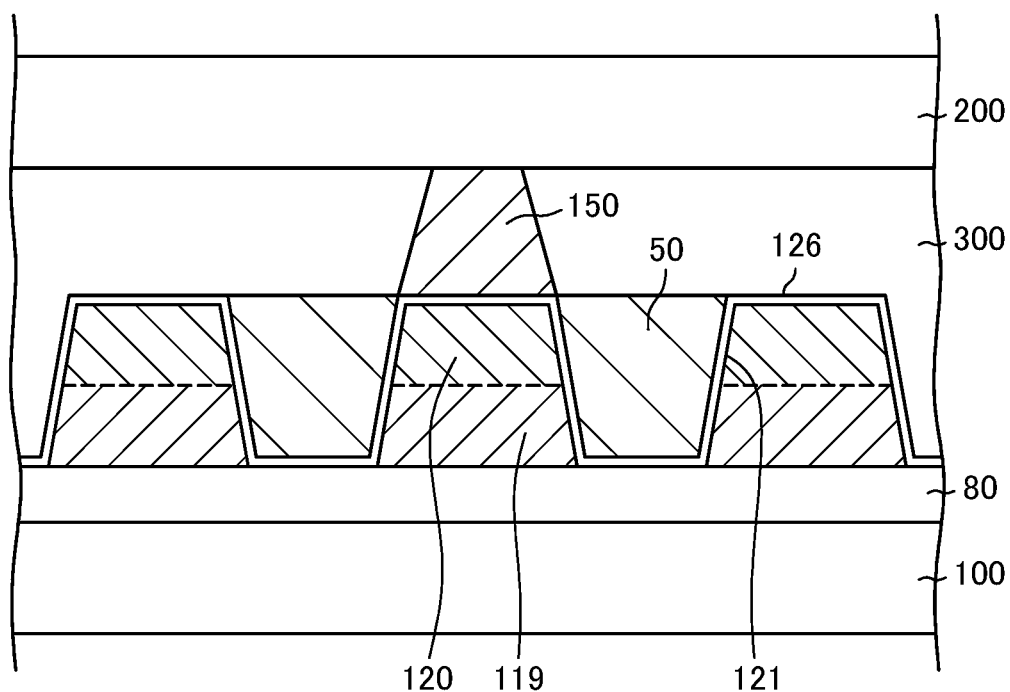
FIG. 30 is a cross sectional view which shows a relation between the columnar spacer and the first through hole filled with the filler.
Figure 31:
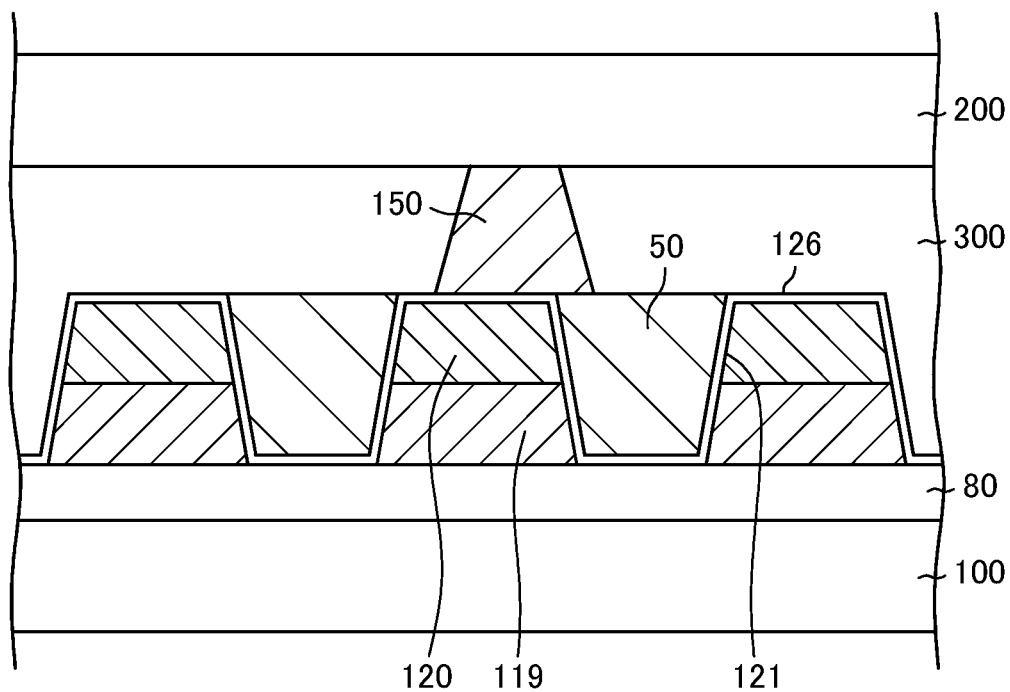
FIG. 31 is a cross sectional view which shows an effect to the columnar spacer when the first through hole is filled with the filler.

FIG. 30 is a cross sectional view of a case where a filling material 50 made of an organic material is formed in the first through hole 121. FIG. 30 is the same as FIG. 24 except that a filling material 50 is formed in the first through hole 121. FIG. 31 is a cross sectional view of a case in which a columnar spacer is displaced in an X-direction due to a manufacturing error. In FIG. 31, since a filling material is formed in the first through hole 121, the columnar spacer 150 does not fall down. Accordingly, the interval between the TFT substrate 100 and the counter substrate 200 can be maintained as a predetermined distance.

As described above, by filling the first through hole 121 with the organic material 50, it is possible to prevent the columnar spacer 150 from falling into the first through hole 121 and to accurately maintain the interval between the TFT substrate 100 and the counter substrate 200. Therefore, a predetermined liquid crystal layer thickness can be maintained.

What is claimed is:

1. A display device including a substrate on which a TFT is formed, the display device comprising,
    an organic film formed on the TFT, the organic film having a through hole, and
    a first common electrode, an upper pixel electrode and a second common electrode which are stacked in this order above the organic film, a filler being filled in the through hole, and
    wherein the upper pixel electrode is electrically connected with the TFT, and
    an edge of the upper pixel electrode is located directly on the filler.

2. The display device according to claim 1, further comprising
    a lower pixel electrode disposed between the organic film and the first common electrode, wherein
    the lower pixel electrode is connected with the TFT via the through hole, and connected with the upper pixel electrode outside the through hole.

3. The display device according to claim 2, wherein
    a first insulating film is formed between the lower pixel electrode and the first common electrode to form a first capacitance,
    a second insulating film is formed between the first common electrode and the upper pixel electrode to form a second capacitance,
    a third insulating film is formed between the upper pixel electrode and the second common electrode to form a third capacitance, and
    the first capacitance, the second capacitance and the third capacitance are connected to each other in parallel.

4. The display device according to claim 1, wherein
    a distance between an upper surface of the filler and the substrate is smaller than a distance between an upper part of the organic film and the substrate.

5. The display device according to claim 1, wherein
    a taper angle of the through hole is 70 degrees or more and 90 degrees or less.

6. The display device according to claim 1, wherein
a taper angle of the through hole is 80 degrees or more and 90 degrees or less.

7. The display device according to claim 1, wherein
the lower pixel electrode, the first common electrode, the upper pixel electrode and the second common electrode are formed of ITO.

8. The display device according to claim 6, wherein
the first common electrode is a laminated structure of an ITO film and a metal film.

9. The display device according to claim 1, further comprising:
in a plan view, a gap is formed between the upper pixel electrode and an upper pixel electrode of an adjacent pixel above the filler.

10. The display device according to claim 9, wherein
an edge of the upper pixel electrode of the adjacent pixel is located directly on the filler.

11. The display device according to claim 1, wherein
a second insulating film is formed between the first common electrode and the upper pixel electrode to form a second capacitance,
a third insulating film is formed between the upper pixel electrode and the second common electrode to form a third capacitance, and
the second capacitance and the third capacitance are connected to each other in parallel.

12. The display device according to claim 1, wherein
the first common electrode, the upper pixel electrode and the second common electrode are formed of ITO.

* * * * *